United States Patent
Horibe et al.

[11] Patent Number: 6,105,848
[45] Date of Patent: Aug. 22, 2000

[54] WIRE BONDING METHOD, WIRE BONDING APPARATUS AND SEMICONDUCTOR DEVICE PRODUCED BY THE SAME

[75] Inventors: Hiroshi Horibe; Kazuko Nakamura; Shinji Toyosaki, all of Tokyo, Japan

[73] Assignee: Mitsubishi Denki Kabushki Kaisha, Tokyo, Japan

[21] Appl. No.: 09/124,834

[22] Filed: Jul. 30, 1998

Related U.S. Application Data

[62] Division of application No. 08/835,802, Apr. 16, 1997, Pat. No. 5,838,071.

[30] Foreign Application Priority Data

Oct. 17, 1996 [JP] Japan .................................... 8-297146

[51] Int. Cl.[7] .................................................. H01L 21/607
[52] U.S. Cl. .................................... 228/110.1; 228/180.5; 228/233.1
[58] Field of Search ................................. 228/110.1, 111, 228/180.5, 1.1, 4.5, 233.1, 235.1; 156/73.2; 219/56.21, 56.22

[56] References Cited

U.S. PATENT DOCUMENTS

| | | |
|---|---|---|
| 3,787,966 | 1/1974 | Klossika . |
| 4,067,039 | 1/1978 | Gaicki . |
| 4,080,485 | 3/1978 | Bonkohara . |
| 4,371,231 | 2/1983 | Jung . |
| 4,444,349 | 4/1984 | Bilane et al. ............................ 228/102 |
| 4,603,802 | 8/1986 | Kurtz et al. .............................. 228/1.1 |
| 4,789,095 | 12/1988 | Kobayashi .............................. 228/102 |
| 4,806,193 | 2/1989 | Raben et al. ............................ 156/378 |
| 4,845,543 | 7/1989 | Okikawa et al. . |
| 4,907,734 | 3/1990 | Conru et al. . |
| 5,060,051 | 10/1991 | Usuda . |
| 5,078,312 | 1/1992 | Ohashi et al. ........................... 228/102 |
| 5,101,263 | 3/1992 | Kitano et al. . |
| 5,172,212 | 12/1992 | Baba . |
| 5,192,015 | 3/1993 | Ingle et al. . |
| 5,229,646 | 7/1993 | Tsumura . |
| 5,431,324 | 7/1995 | Kajiwara et al. ....................... 228/102 |
| 5,455,461 | 10/1995 | Koide et al. . |
| 5,495,667 | 3/1996 | Farnworth et al. . |
| 5,525,839 | 6/1996 | Shu . |

FOREIGN PATENT DOCUMENTS

| | | |
|---|---|---|
| 29 45 670 B1 | 7/1981 | Germany . |
| 39 38 152 A1 | 7/1990 | Germany . |
| 2-90640 | 3/1990 | Japan . |
| 4-279040 | 10/1992 | Japan . |

OTHER PUBLICATIONS

Patents Abstracts of Japan, E–1397, Jul. 14, 1993, vol. 17/No. 375, JP 5–63038(A), filed Dec. 03, 1993.

Patents Abstracts of Japan, E–1037, Feb. 22, 1991, vol. 15/No. 78, JP 2–297949 filed Oct. 12, 1990.

"The Effect of Ultrasonic Frequency on Intermetallic Reactivity of Au–Al Bonds," Thomas H. Ramsey, Cesar Alfaro, *Texas Instruments Incorporated*, Dallas, Texas, Dec. 1991 Solid State Technology.

"Correlation Between Electrical Resistance and Microstructure in Gold Wirebonds on Aluminum Films" Lisa Maiocco, Donna Smyers, Paul R. Munroe, and Ian Baker, 1990 IEEE.

Patent Abstracts of Japan, E–1321 Feb. 18, 1993, vol. 17/No. 81, JP 4–279040(A), filed May 10, 1992.

Patents Abstracts of Japan, E–1355, Apr. 23, 1993, vol. 17/No. 209, JP 4–348047(A), filed Mar. 12, 1992.

*Primary Examiner*—Samuel M. Heinrich
*Attorney, Agent, or Firm*—Oblon, Spivak, McClelland, Maier & Neustadt, P.C.

[57] ABSTRACT

A wire bonding method for joining a metal wire with a bonding pad disposed on a semiconductor element by using a load and supersonic wave vibration, comprising: during interval of time from contact of the metal wire with the bonding pad to application of the supersonic wave vibration, continuously applying a first bonding load and a second bonding load which is lower than the first bonding load; and after application of the supersonic wave vibration, continuously applying a third bonding load of a size of about 50% of the load of the second bonding load and a fourth bonding load which is lower than the first bonding load and higher than the third bonding load. The reliability of the fine wire bonding joint is improved remarkably, whereby a high quality semiconductor device can be produced at a low cost.

6 Claims, 24 Drawing Sheets

(a)

(b)

(c)

(d)

(a)

(b) (c)

(d)

(a)

(b)

(c)

(d)

WIRE BONDING METHOD, WIRE BONDING APPARATUS AND SEMICONDUCTOR DEVICE PRODUCED BY THE SAME

This application is a division of Ser. No. 08/835,802 filed Apr. 16, 1997 now U.S. Pat. No. 5,838,071.

BACKGROUND OF THE INVENTION

The present invention relates to a wire bonding method for improving the reliability of the fine wire bonding joint, a wire bonding apparatus, and a semiconductor device formed by using the wire bonding method and apparatus.

Heretofore, in the assembling process of semiconductor devices, there has been extensively used a method of using both thermal pressure bonding and supersonic wave vibration as a method of bonding a metal wire to the bonding pad on a semiconductor device. To meet the trend of reduction in size and pitch of the bonding pad in recent years, establishment of the wire bonding method for obtaining the bonding in higher reliability is necessitated. FIG. 24 shows a relationship between the load and application timing of supersonic wave vibration and the bonding time by the wire bonding method shown for example in Japanese Unexamined Patent Publication No. 279040/1992. According to the embodiment, there is adopted a multi-stage loading by employing a low load A between the high load and the low load B, so as to make the low load A lighter than the low load B. The application of the supersonic wave vibration is commenced at the time of the high load.

As described above, according to the conventional wire bonding method, the bonding load amount for duration from the contact of the metal wire with the bonding pad to the time of application of the supersonic wave vibration is constant. For this reason, there have been problems that, when the load amount at such time is set to a high amount to such a degree that nucleus of bond is formed, the deformation of metal wire becomes excessively large, while on the other hand, when the deformation amount is set to a low level to such a degree that the deformation amount can be suppressed, the nucleus of bond cannot be sufficiently formed. Furthermore, since the supersonic wave vibration is additionally applied during the application of load, the tendency for deformation of the metal wire to become excessively large is further accelerated, so that there has been a problem that formation of a fine wire bonding joint becomes impossible.

The present invention has been developed to solve the problems as described above, and an object of the present invention is to provide a wire bonding method and apparatus in which the nucleus of bond is sufficiently formed at the joint between the metal wire and bonding pad, and deformation amount of the metal wire can be set to a moderate level, so that the reliability of fine wire bonding joint is improved, and to obtain a high quality semiconductor device having highly reliable bond by using the above method and apparatus.

SUMMARY OF THE INVENTION

In accordance with the present invention, there is provided a semiconductor device comprising a semiconductor element, a lead frame connected to the semiconductor element with a die bond material, and a metal wire for electrically connecting the semiconductor element and the lead frame, wherein a joint between the bonding pad disposed on the semiconductor element and the metal wire comprises a plurality of island shaped joints and a band-like joint surrounding the whole island shaped joints.

Further, the lead frame includes Cu as a main component, and the die bond material includes resin as a main component.

Moreover, the metal wire includes Au as a main component, and the bonding pad includes Al as a main component.

In accordance with the present invention, there is also provided a wire bonding method for joining a metal wire with a bonding pad disposed on a semiconductor element by using a load and supersonic wave vibration, comprising: during interval of time from contact of the metal wire with the bonding pad to application of the supersonic wave vibration, continuously applying a first bonding load and a second bonding load which is lower than the first bonding load; and after application of the supersonic wave vibration, continuously applying a third bonding load of a size of about 50% of the load of the second bonding load and a fourth bonding load which is lower than the first bonding load and higher than the third bonding load.

Also, the metal wire has a metal ball at a tip portion of the metal wire to be connected to the bonding pad.

The bonding load amount divided by the sectional area prior to deformation of the metal ball is made to 40–60 mgf/$\mu$m$^2$ at the time of the first bonding load, 10–20 mgf/$\mu$m$^2$ at the time of the second bonding load, 4–10 mgf/$\mu$m$^2$ at the time of the third bonding load, and 10–20 mgf/$\mu$m$^2$ at the time of the fourth bonding load.

Furthermore, the time of application of the first bonding load is not more than 3 ms, the time of application of the third bonding load is 5 to 15 ms, and the time of application of the fourth bonding load is 1 to 5 ms.

In accordance with the present invention, there is further provided a wire bonding apparatus for joining a metal wire with a bonding pad disposed on a semiconductor element by using a load and supersonic wave vibration, comprising: a stage to place a semiconductor device including the semiconductor element; a bonding head for positioning the metal wire on the bonding pad with holding the metal wire, and applying a load and supersonic wave vibration; a mechanism to monitor change with time of the load amount of the bonding head; and a load control mechanism and a supersonic wave amplitude control mechanism having a conversion function or conversion table to show correlation between the change with time of the load amount and the strength and deformation of the joint, and on receipt of result from the monitor mechanism, calculating a subsequent load amount and amplitude of the supersonic wave vibration to control the bonding head.

BRIEF EXPLANATION OF THE DRAWINGS

FIGS. 1(a) and 1(b) show a constitution of a semiconductor device for illustrating a wire bonding method of Embodiment 1 of the present invention, wherein FIG. 1(a) is a sectional view and FIG. 1(b) is a partial sectional view of the joint portion;

in FIG. 3 is preserved at a temperature of 150° C. for 15 hours;

in FIG. 3 is preserved at a temperature of 150° C. for 15 hours;

DETAILED DESCRIPTION

Embodiment 1

Figure 1A:
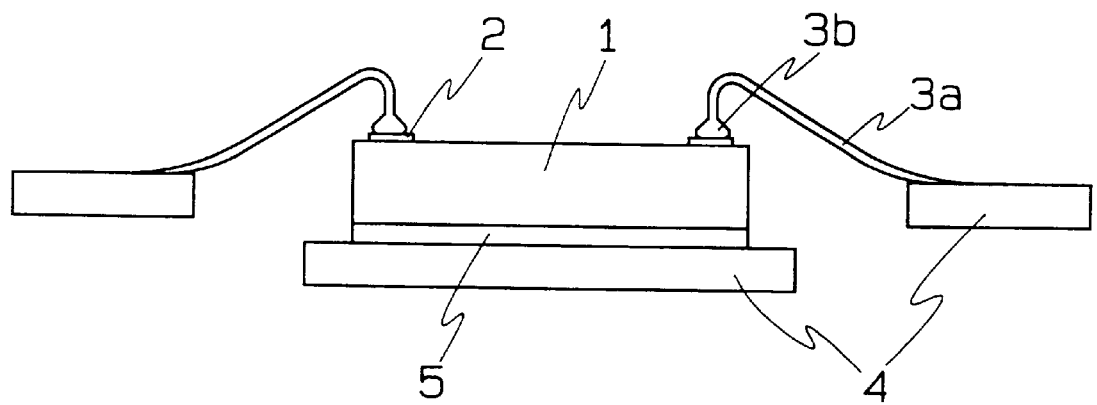
Figure 1B:
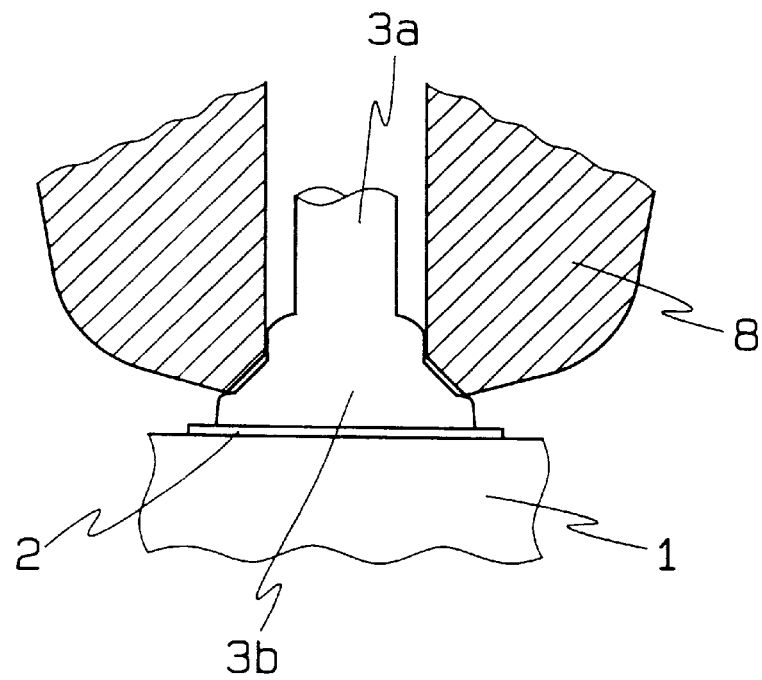
Figure 2:
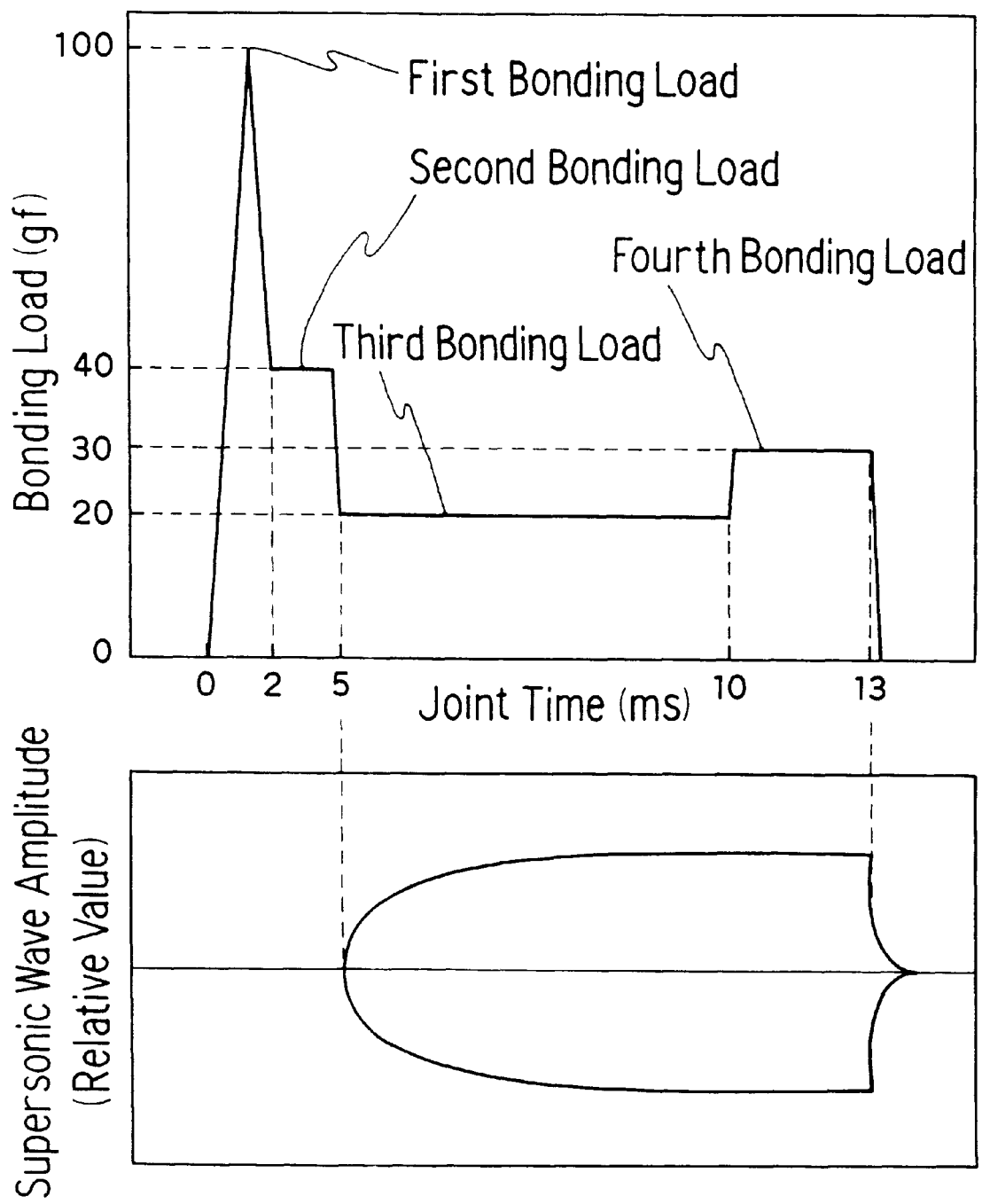
FIG. 2 is a view to show relationship between load and timing for application of supersonic wave vibration, and joint time according to the wire bonding method of Embodiment 1 of the present invention.

Hereinafter, the first embodiment of the present invention will be explained with reference to the drawings. FIG. 1(a) is a cross-sectional view to show the constitution of the semiconductor device for illustrating the wire bonding method according to the first embodiment of the present invention, and FIG. 1(b) is a partial cross-sectional view showing the joint portion. Further, FIG. 2 is a view to show relationship between load and timing for application of supersonic wave vibration, and joint time in the wire bonding method of this embodiment. In the drawings, numeral 1 shows a semiconductor element, 2 a bonding pad disposed on the semiconductor element 1, 3a a metal wire, 3b a metal ball formed at the tip of the metal wire 3a, 4 a lead frame, 5 a die bond material for connecting the semiconductor element 1 and the lead frame 4, and 8 a capillary, respectively.

Figure 19:
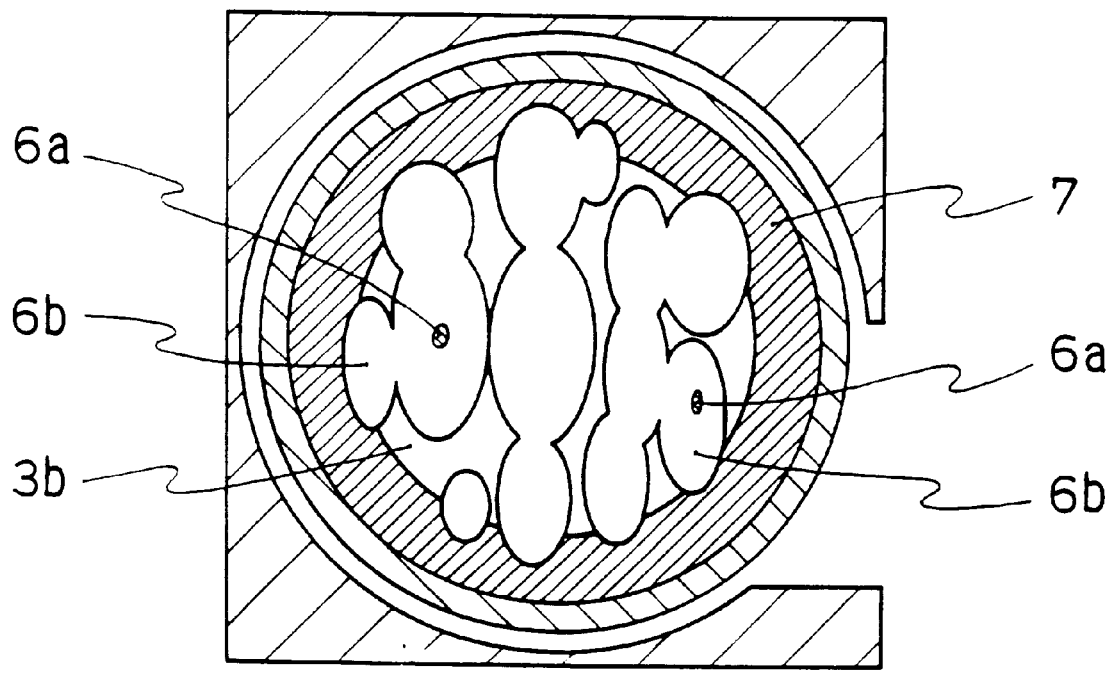
FIG. 19 is a view showing one joint condition of FIG. 18.

In this embodiment, the semiconductor element 1 is mechanically and electrically connected to the lead frame 4 comprising mainly Cu by using a die bond material 5 which comprises mainly polyimide and epoxy resin, having phenol as a curing agent, and filled with silver powder. The following explanation is given on the case where a metal wire 3a comprising mainly Au of 30 μm in diameter and having a metal ball 3b of about 55 μm in diameter, made by melting and solidifying the tip of the metal wire 3a is joined to a bonding pad 2 of 80 μm in one side comprising mainly Al and formed on the semiconductor element 1, by using the load and supersonic wave energy of about 60 kHz supplied through the capillary 8 and heat supplied from the lower face of the semiconductor element 1. FIGS. 3 to 19 are views to show forming conditions of inter-metal compounds at the joint portion between the metal ball 3b and the bonding pad 2. In FIG. 19, numeral 6a shows a joint nucleus serving as a starting point of joint, 6b an island-shaped joint, and 7 a band-like joint formed in a manner to surround the whole joint 6b. Further, in each of FIGS. 3 to 18 and FIGS. 20 to 21, the upper figure (a), the middle left figure (b), the middle right figure (c), and the lower figure (d) show respectively a typical joint portion at the upper side, a typical joint portion at the middle left side, a typial joint portion at the middle right side, and a typical joint portion at the lower side of a rectangular semiconductor device. In FIGS. 3 to 18 and 20 to 21, whitish or gray portions at about a center of the figures show island-shaped joints (refer to FIG. 19).

Firstly, after contact of the metal ball 3b with the bonding pad 2, the first bonding load amount is raised in a sharp gradient to about 120 gf to produce mutually abrupt plastic flow on a joint interface between the metal wire 3a and the bonding pad 2. The sharp gradient rise of the load can be realized by the high speed descending motion of the capillary 8. By this plastic flow it is possible to exclude locally oxide film and the like on the material surface by the load only, without supplying sliding energy at the interface of contact, and to form evenly in the contact interface a joint nucleus 6a which becomes the starting point of the joint. In such a case, the surface of the bonding pad 2 might be provided with a projection of about several μm so as to facilitate formation of the joint nucleus 6a. For forming the projection, there might be employed a method of growing an Al single crystal projection by providing for example a bonding pad 2 with heat treatment.

Thereafter, the second bonding load amount until application of supersonic wave vibration is controlled to a low amount of about 40 gf at which the vibration of the horn holding the upper part of the capillary 8 can be suppressed. By this step, the contact between the metal ball 3b and bonding pad 2 at the joint portion 6a is secured, and re-contamination of the surface of the joint nucleus 6a by oxidation and the like can be suppressed.

Next, at the time of applying supersonic wave vibration, the third bonding load is applied in the range of about 10 to 20 gf for a duration of about 10 ms, so as to make energy of supersonic wave vibration work in a concentrated manner in the region of not more than several $\mu$m centering on each joint nucleus 6a, whereby it is possible to suppress extra vibration at the contact interface between the metal ball 3b and bonding pad 2 and to grow uniformly plural island-shaped joints 6b of approximately elliptical shape centering on the joint nucleus 6a. FIGS. 3 to 6 show conditions of the joints in cases of the application of the first to third bonding load amounts at the respective joint temperatures of 210, 230, 250, and 280° C. The size of the island-shaped joint 6b to be formed is variable according to the joining temperature. In the temperature range of the present experiment, there is a tendency that the lower the temperature is, the individual sizes of the island-shaped joints 6b become smaller. Further, even at 210° C., the island-shaped joint 6b is sufficiently formed.

Figure 7:
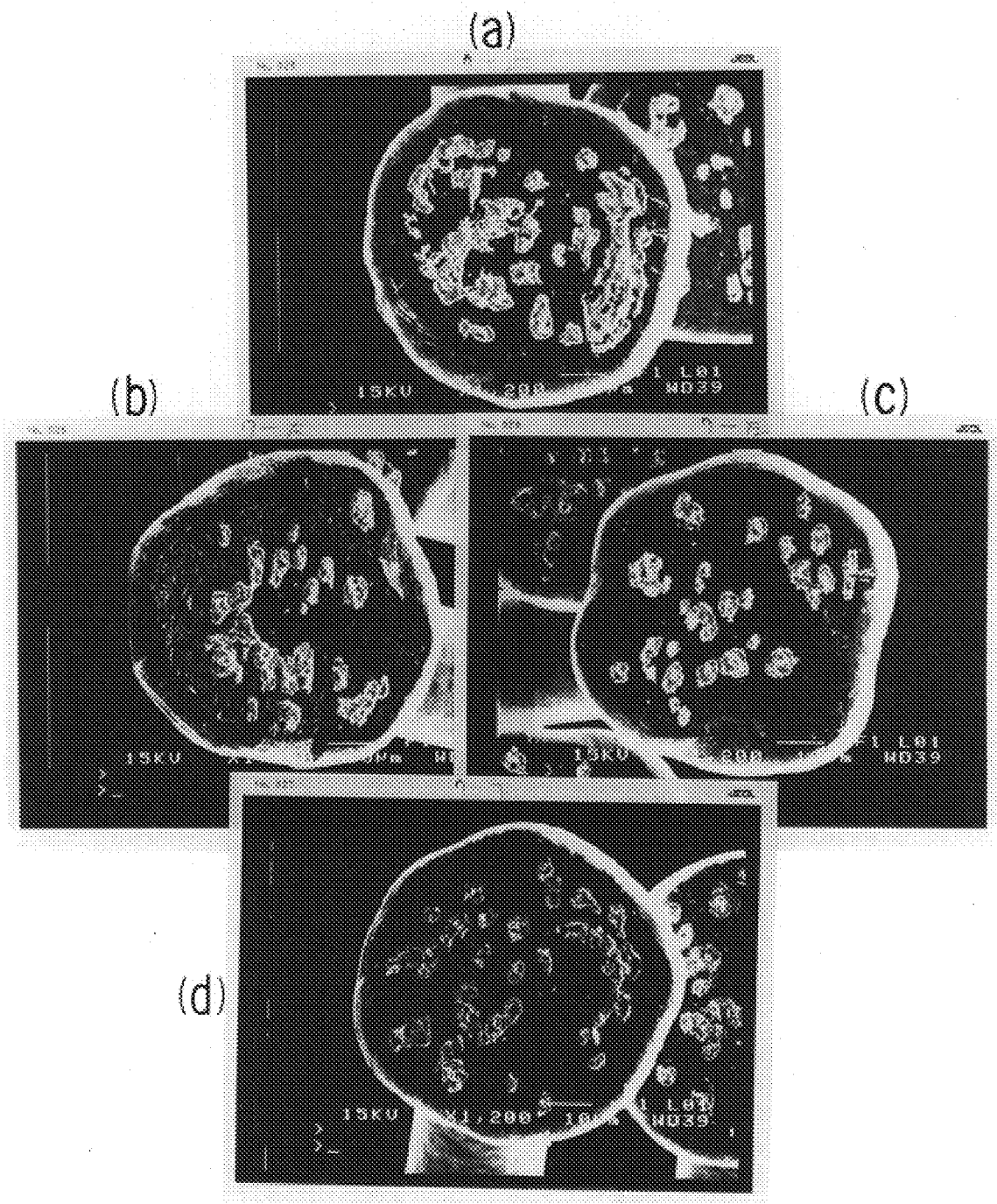
FIG. 7 is a view to show the joint condition after application of the third load at a temperature of 210° C. in the case where amplitude of the supersonic wave is made smaller by 40% in Embodiment 1.
Figure 8:
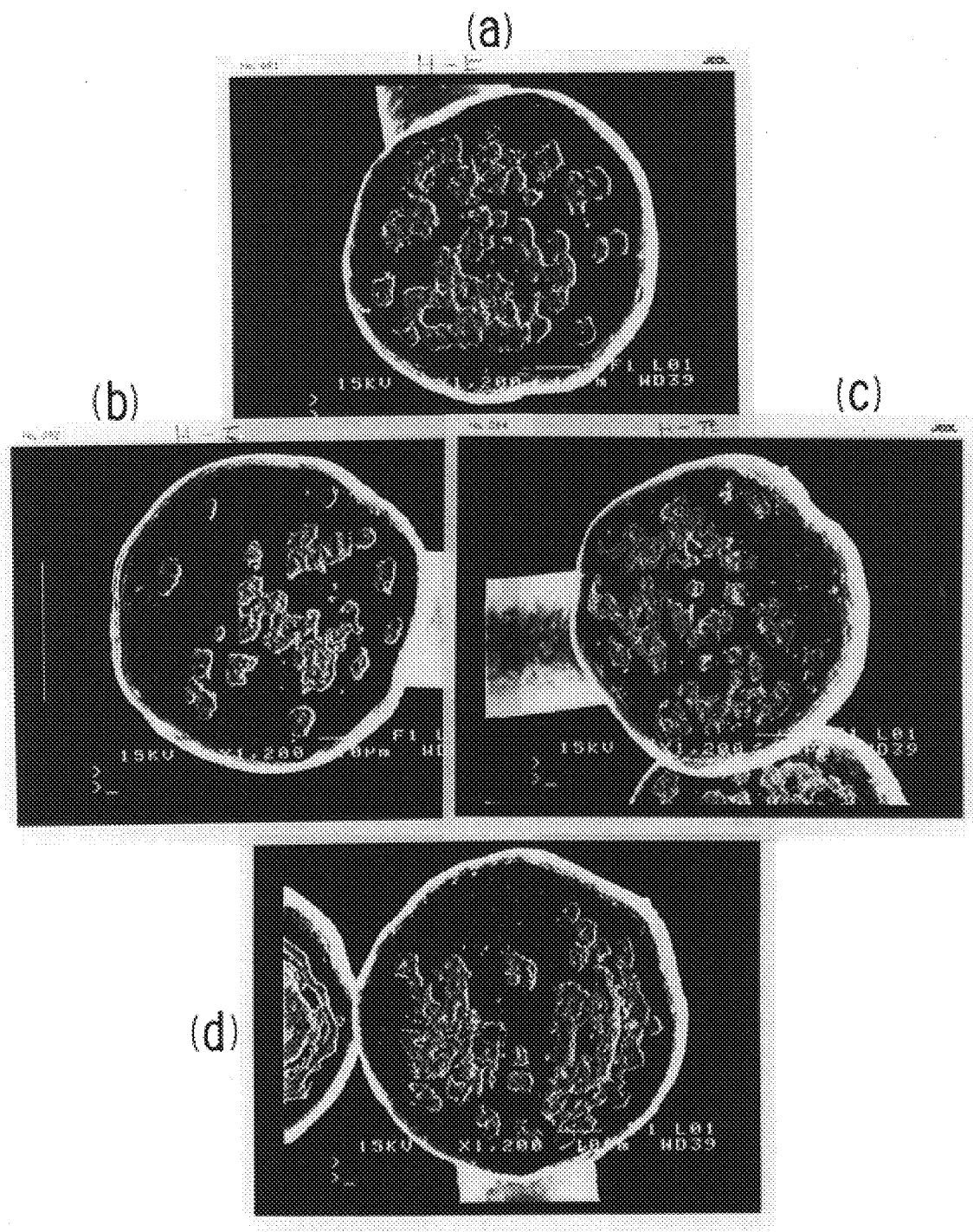
FIG. 8 is a view to show the joint condition after application of the third load at a temperature of 280° C. in the case where amplitude of the supersonic wave is made smaller by 40% in Embodiment 1.
Figure 9:
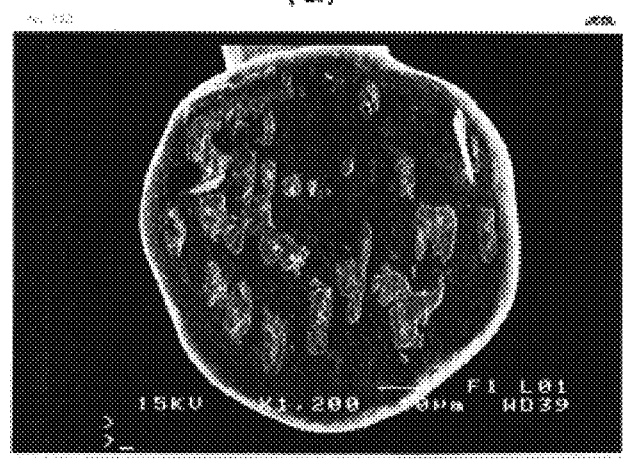
FIG. 9 is a view to show the joint condition after application of the third load at a temperature of 210° C. in the case where application time of the third load is made to 3 ms in Embodiment 1.
Figure 9:
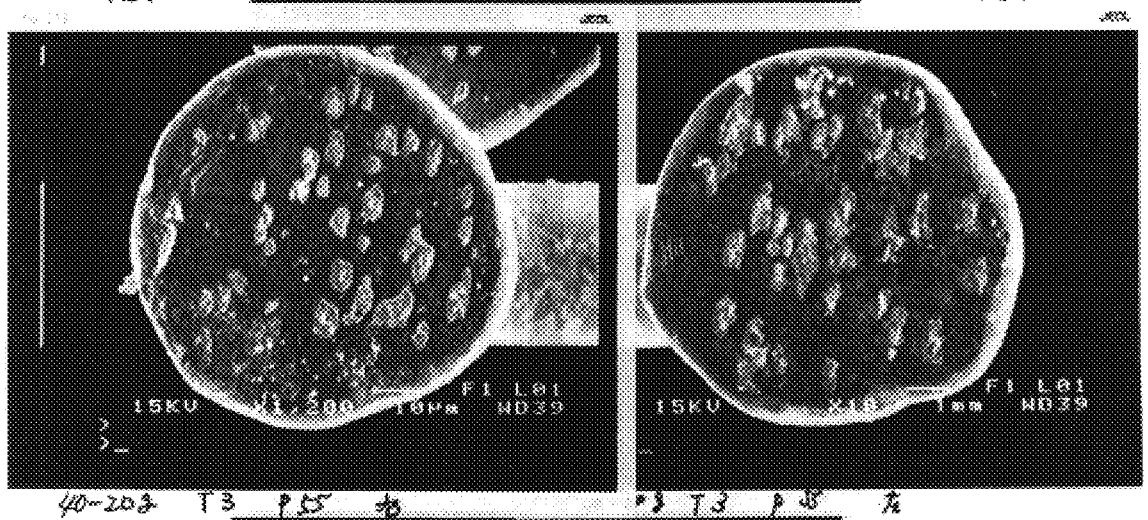
Figure 9:
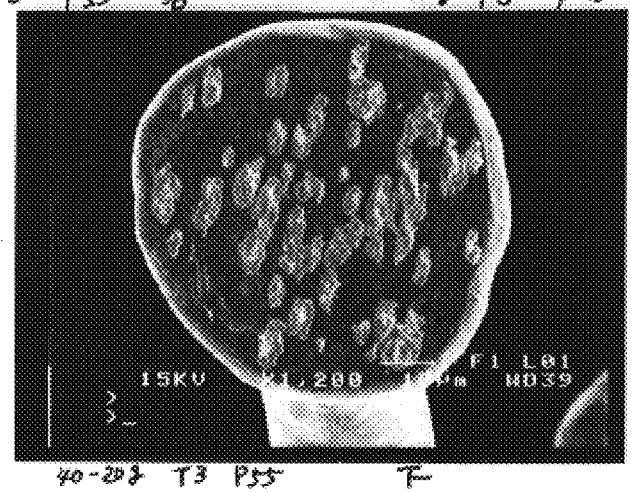
Figure 10:
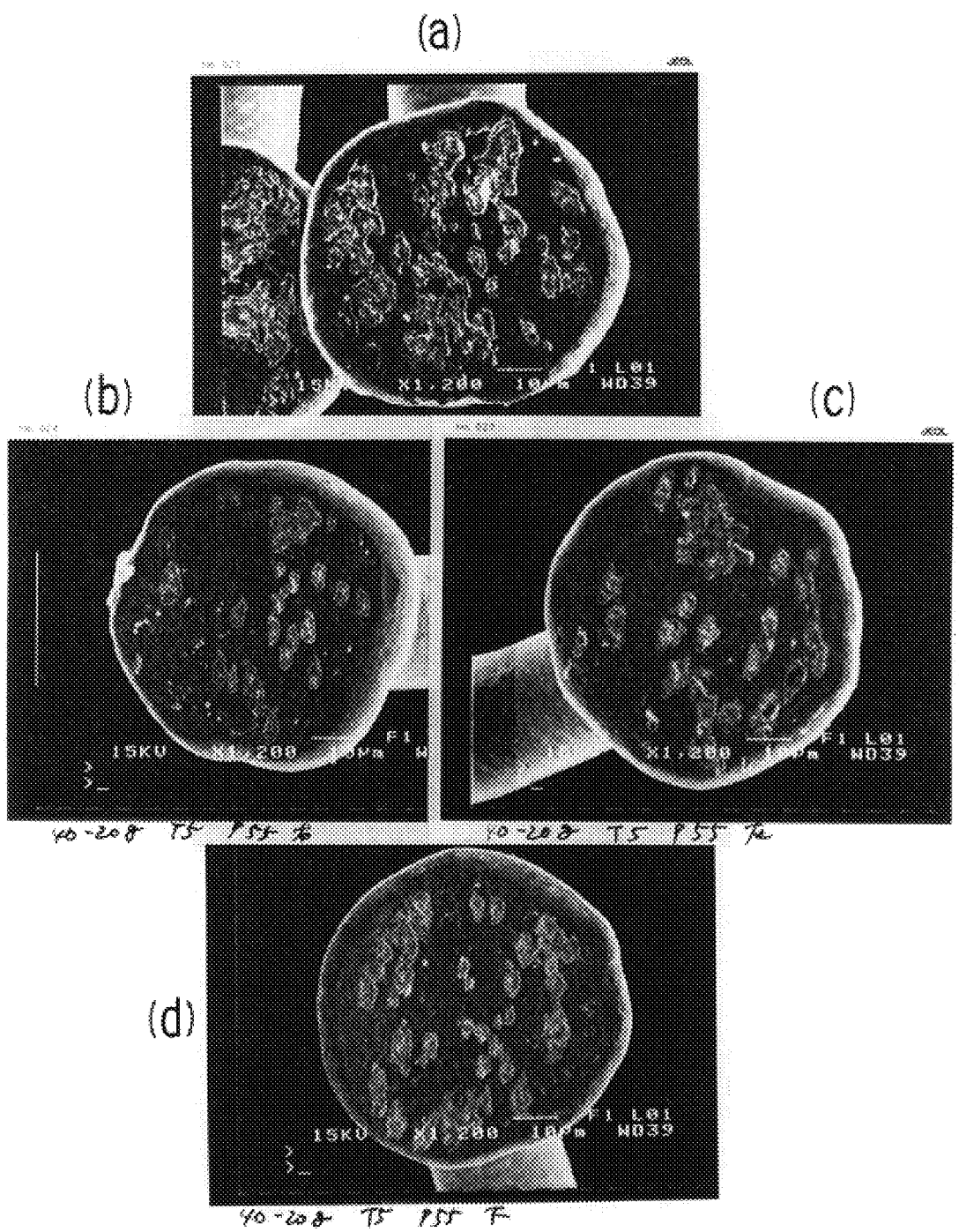
FIG. 10 is a view to show the joint condition after application of the third load at a temperature of 210° C. in the case where application time of the third load is made to 5 ms in Embodiment 1.
Figure 11:
FIG. 11 is a view to show the joint condition after application of the third load at a temperature of 210° C. in the case where application time of the third load is made to 10 ms in Embodiment 1.
Figure 11:
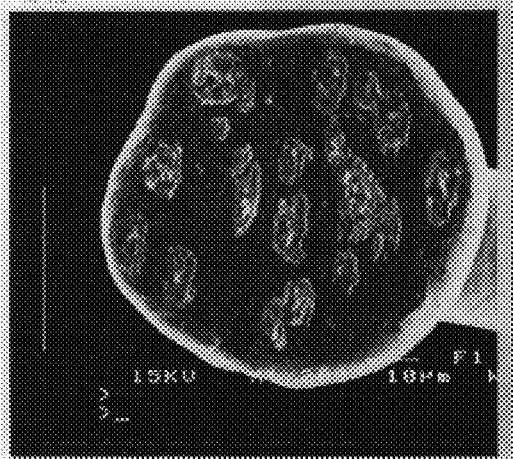
Figure 11:
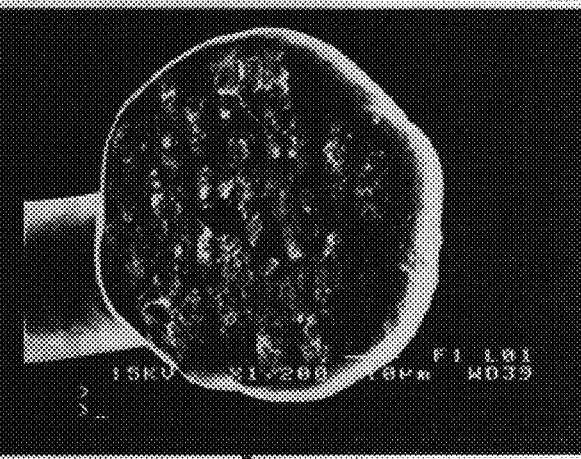
Figure 11:
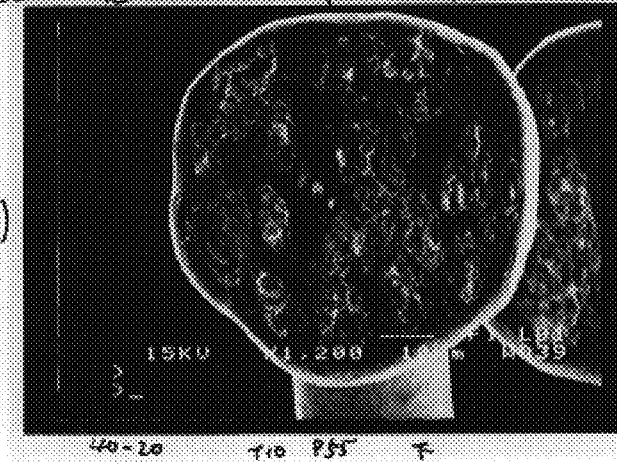
Figure 12:
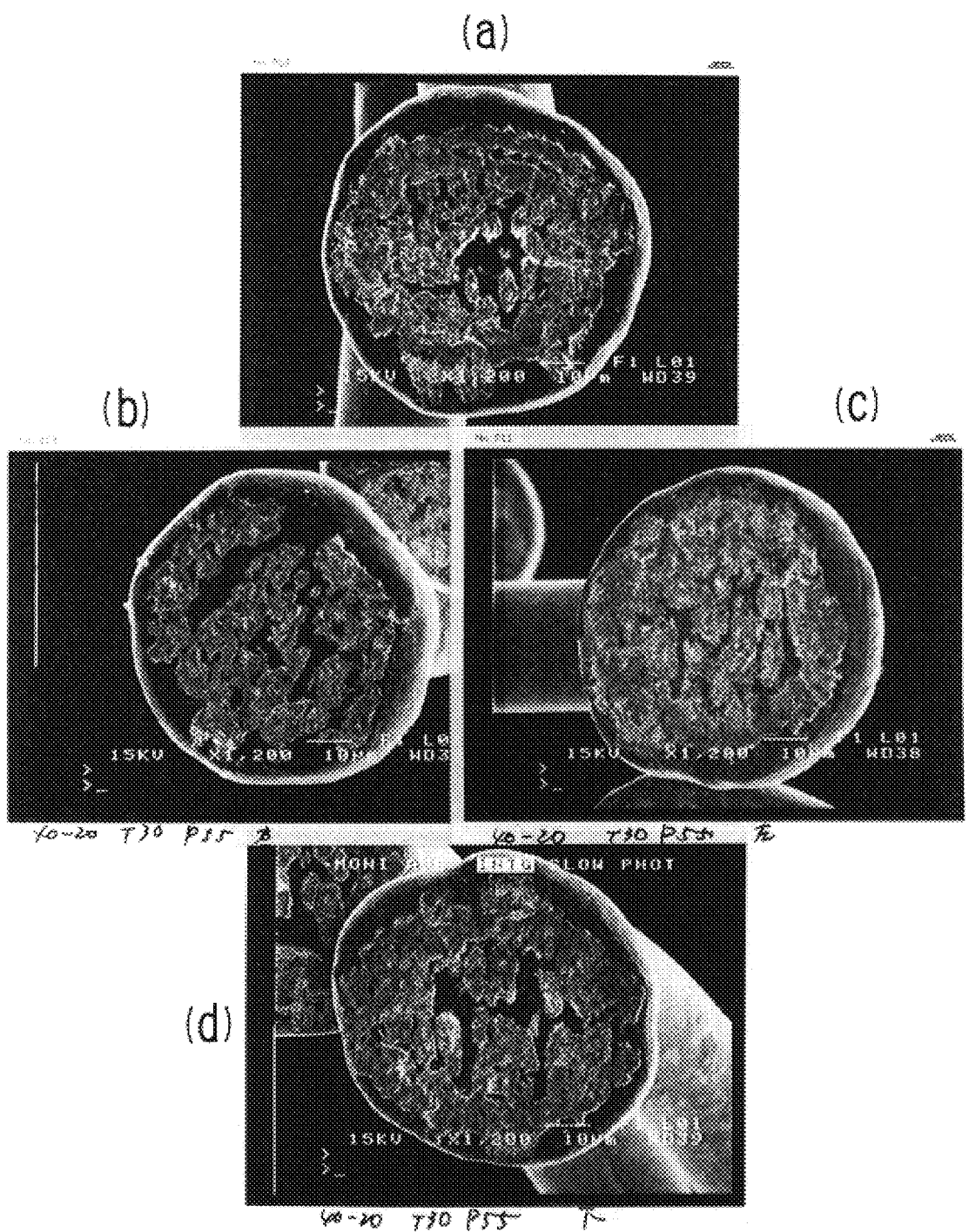
FIG. 12 is a view to show the joint condition after application of the third load at a temperature of 210° C. in the case where application time of the third load is made to 30 ms in Embodiment 1.
Figure 13:
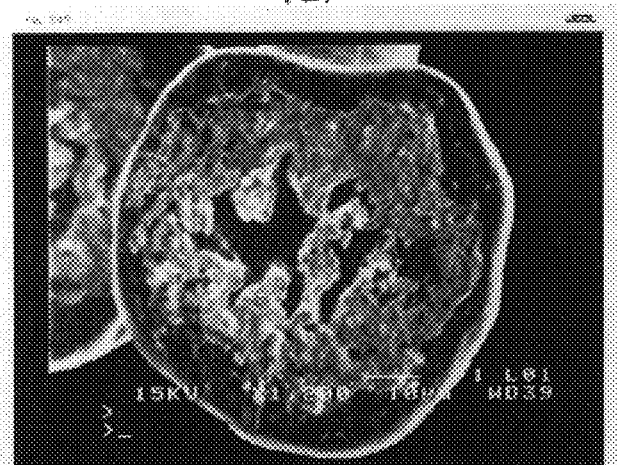
FIG. 13 is a view to show the joint condition after application of the third load at a temperature of 210° C. in the case where application time of the third load is made to 50 ms in Embodiment 1.
Figure 13:
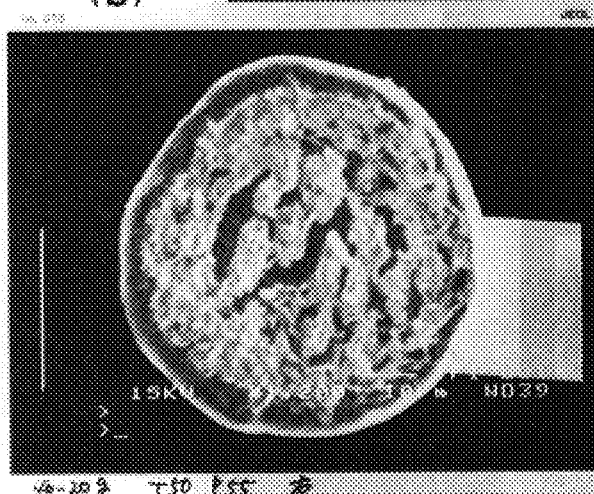
Figure 13:
Figure 13:
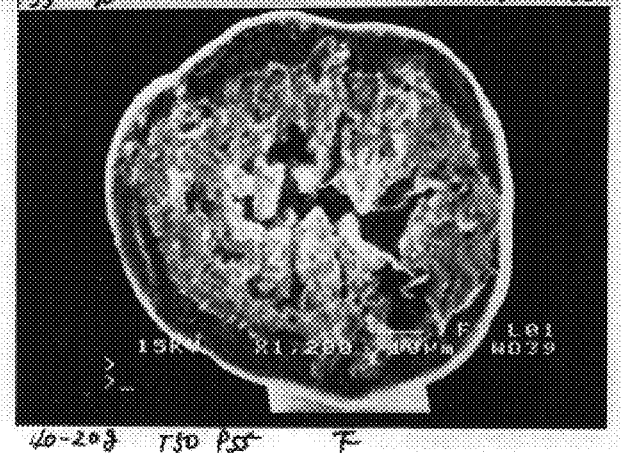

FIG. 7 and FIG. 8 show the cases where amplitudes of the supersonic wave vibration were made smaller by 40% at the joining temperatures of 210° C. and 280° C., with other conditions kept at the same levels as the samples of FIGS. 3 to 6. When the two cases are compared, it is seen that the cases having the larger amplitude of the supersonic wave vibration (FIGS. 3 to 6) show formation of the island-shaped joint 6b in the large size. Further, FIGS. 9 to 13 show the cases where time of application of the third bonding load was changed to 3, 5, 10, 30, and 60 ms at 210° C., showing that the longer the application time is, the larger the island-shaped joint 6b grows. As shown in FIGS. 3 to 13, the individual size of the island-shaped joint 6b can also be controlled by the amplitude of supersonic wave vibration and time of application of the third bonding load.

Figure 3:
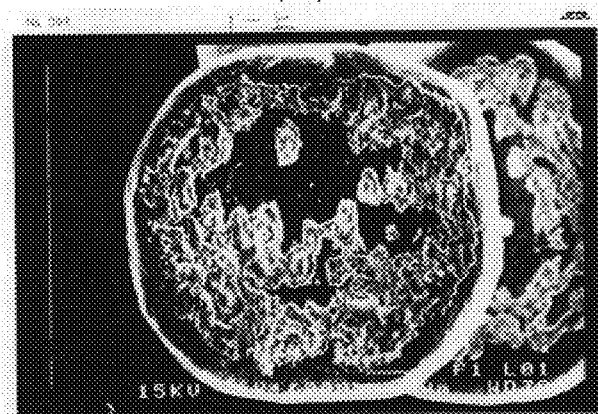
FIG. 3 is a view to show the joint condition after application of the third load at a temperature of 210° C. in Embodiment 1.
Figure 3:
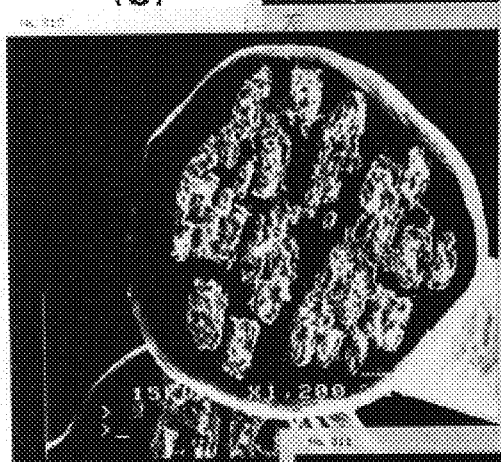
Figure 3:
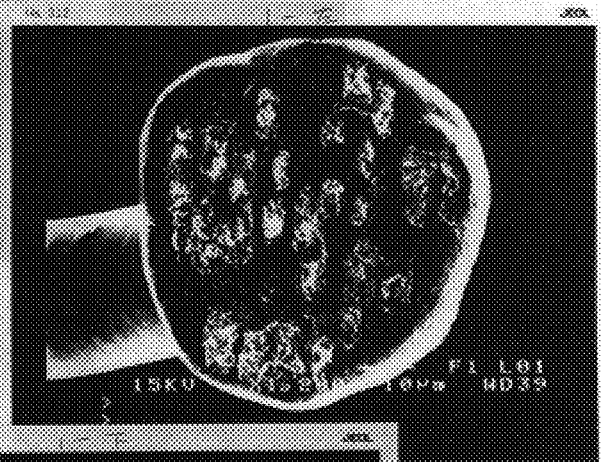
Figure 3:
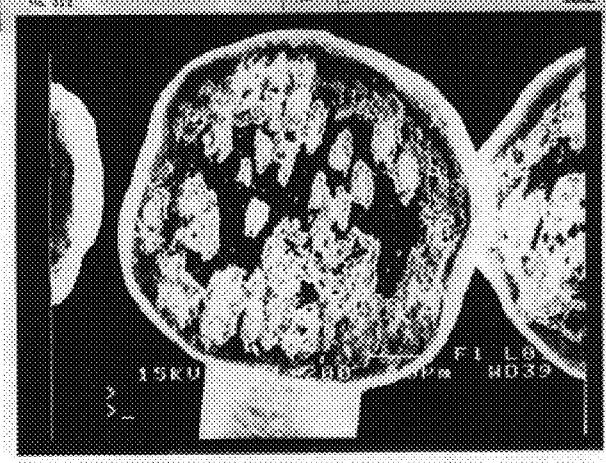
Figure 4:
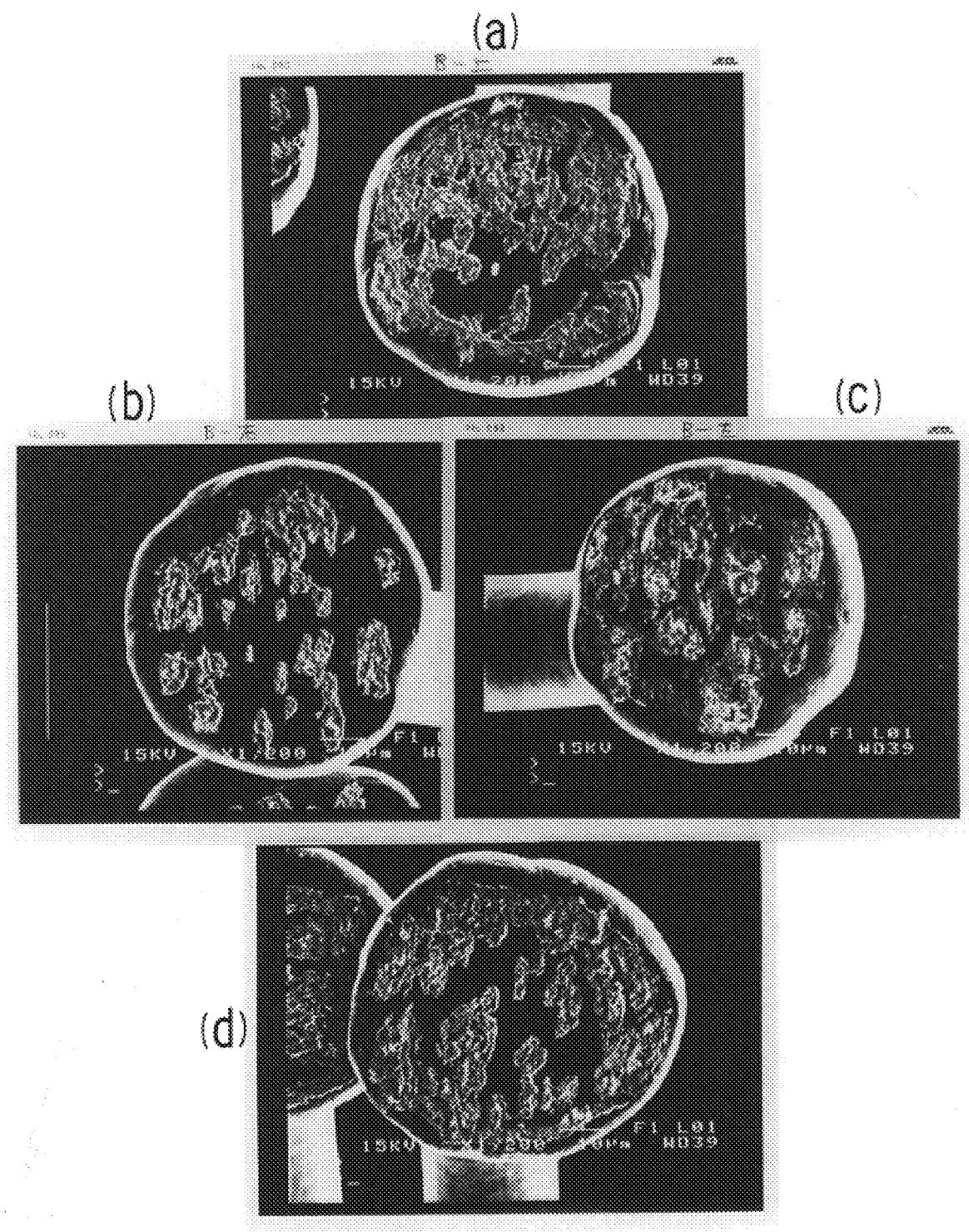
FIG. 4 is a view to show the joint condition after application of the third load at a temperature of 230° C. in Embodiment 1.
Figure 5:
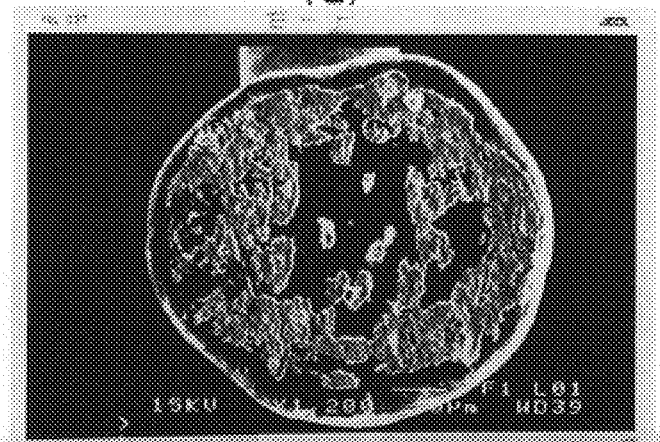
FIG. 5 is a view to show the joint condition after application of the third load at a temperature of 250° C. in Embodiment 1.
Figure 5:
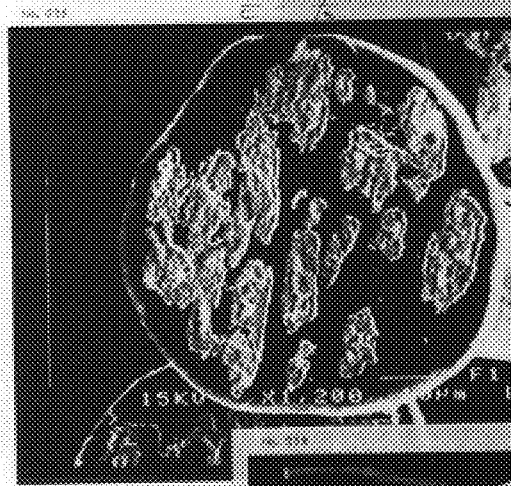
Figure 5:
Figure 5:
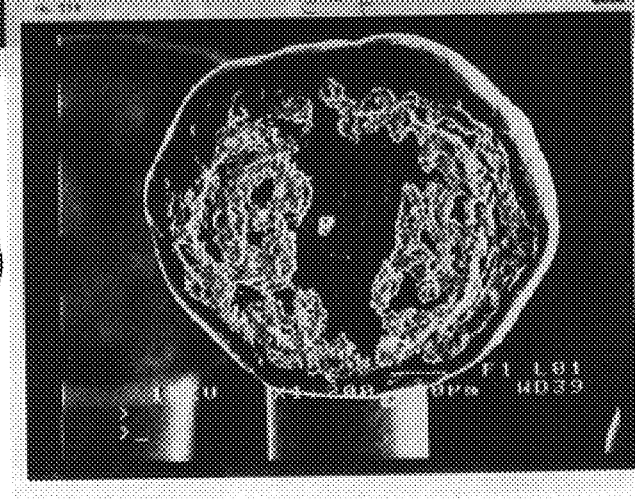
Figure 6:
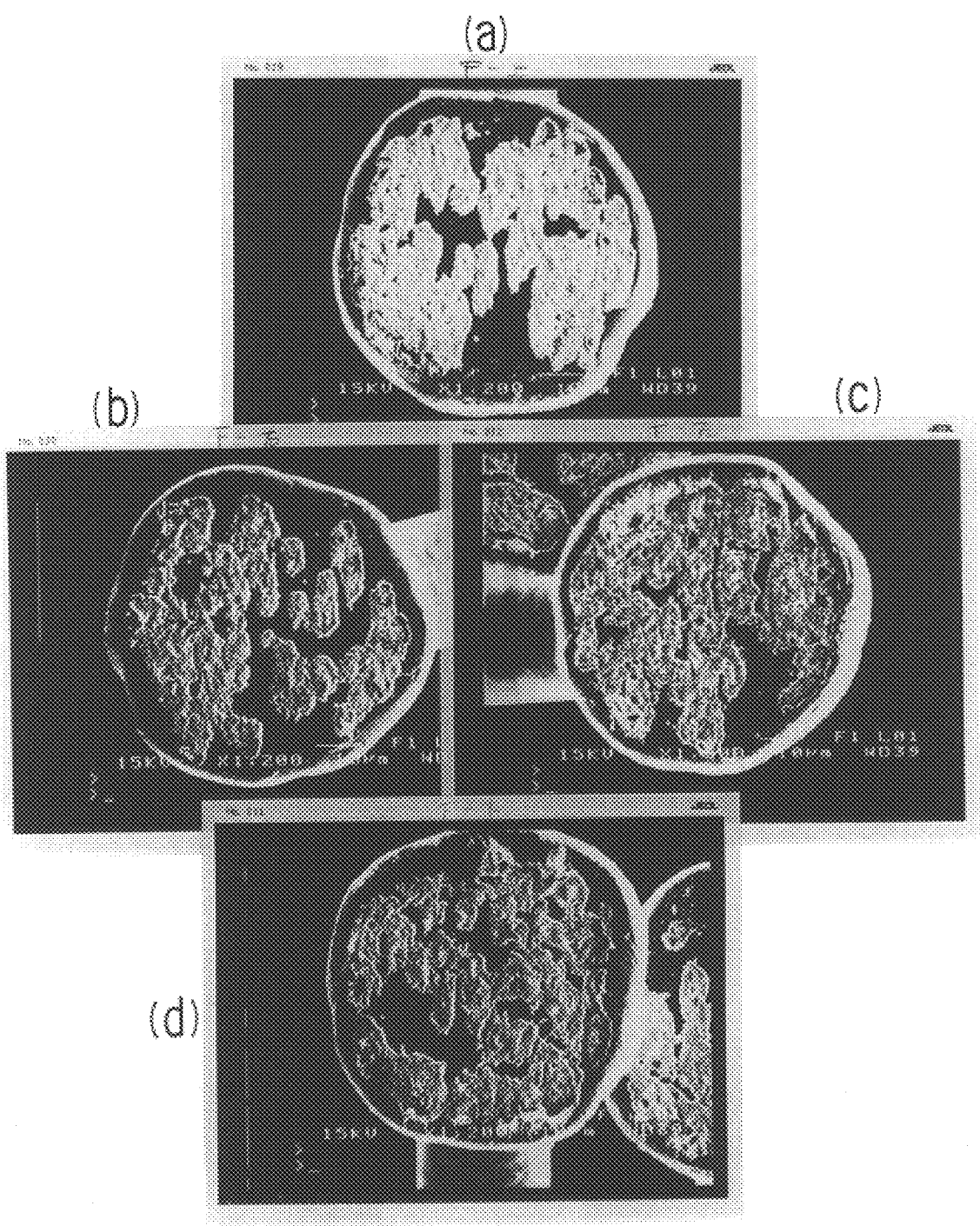
FIG. 6 is a view to show the joint condition after application of the third load at a temperature of 280° C. in Embodiment 1.
Figure 14:
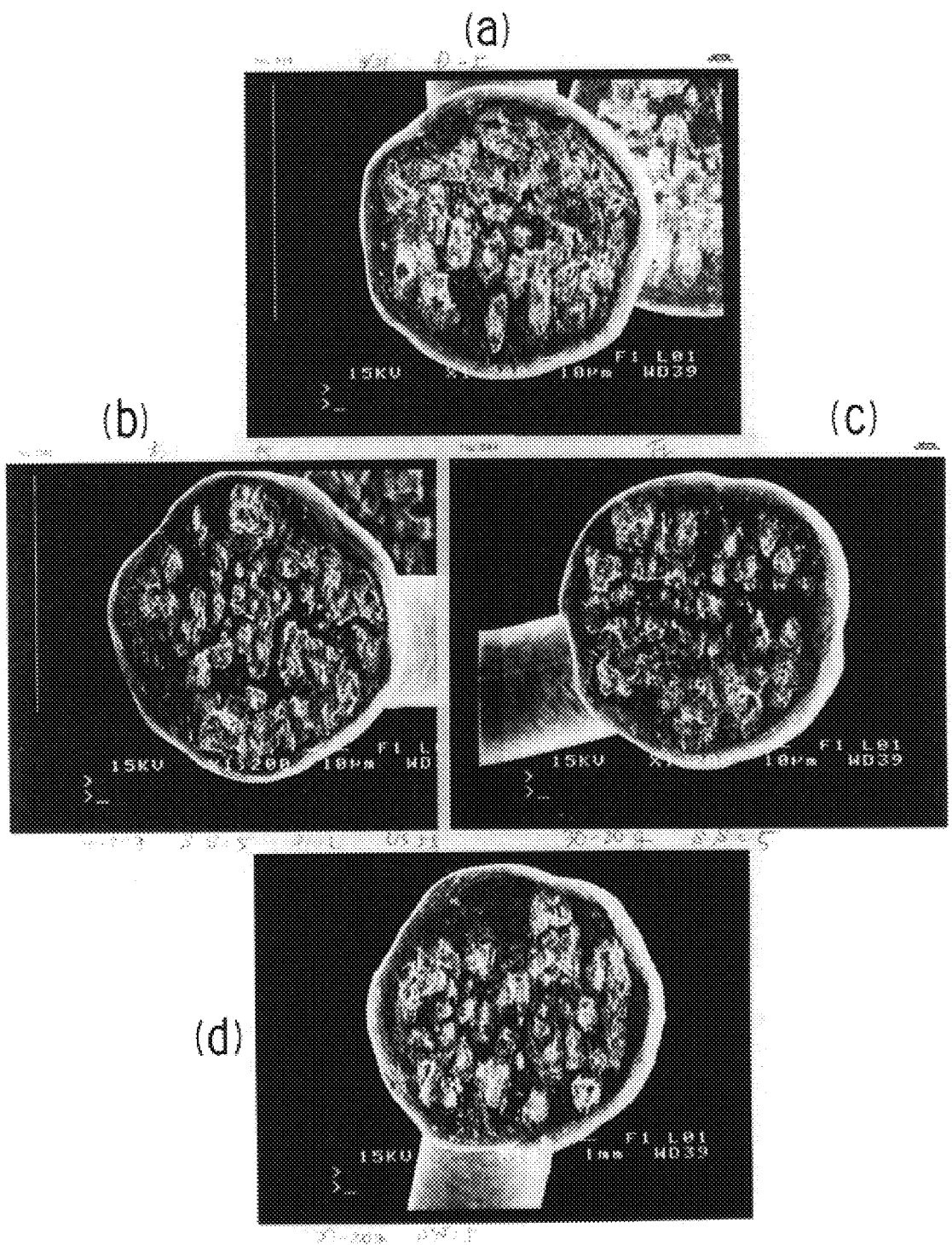
FIG. 14 is a view to show the joint condition after application of the third load in the case where the first load is reduced to 100 gf and the second load to 30 gf in Embodiment 1.
Figure 15:
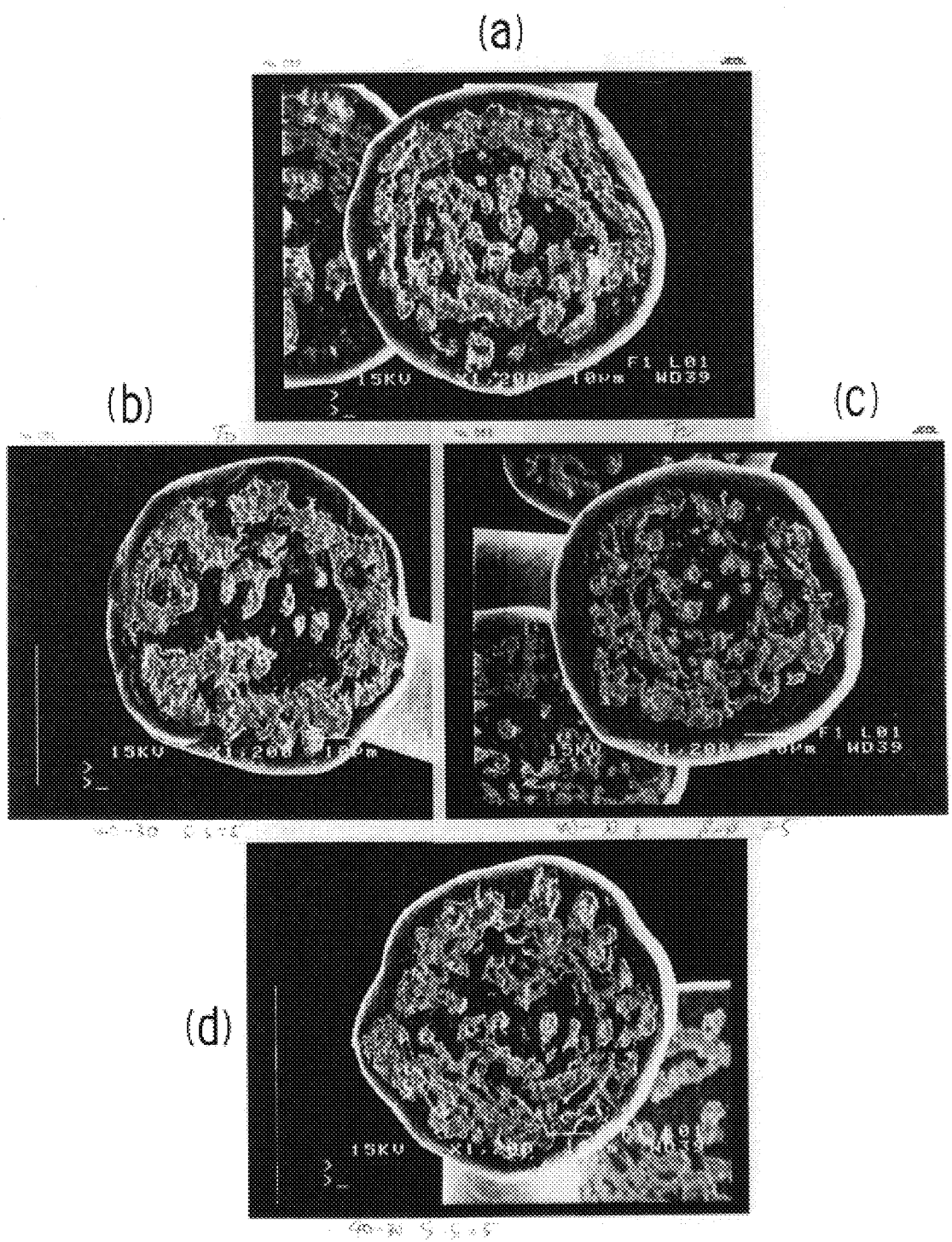
FIG. 15 is a view to show the joint condition after application of the third load in the case where the third load is increased to 30 gf in Embodiment 1.

FIG. 14 is a view to show the condition of the joint in the case where the first bonding load and the second bonding load were lowered to 100 gf and 30 gf, respectively, and the third bonding load was applied in the range of about 10 to 20 gf. Even in such a case, the island-shaped joint 6b was formed. However, when, as shown in FIG. 15, the first bonding load was set back to 120 gf and the second bonding load to 40 gf and the third bonding load was raised to 30 gf, it became impossible to give sufficient supersonic wave vibration energy to the neighborhood of the joint nucleus 6a to provide insufficient joint. Further, FIGS. 16 and 17 are views to show conditions where the samples of joint temperatures at 210° C. and 280° C. as shown in FIG. 3 were preserved at 150° C. for 15 hours, and the island-shaped joint 6b could be observed even after the preservation at a high temperature.

Figure 16:
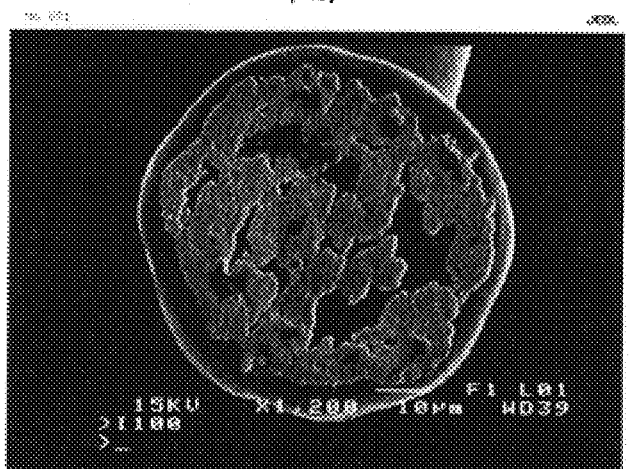
FIG. 16 is a view to show the joint condition in the case where the sample of 210° C.
Figure 16:
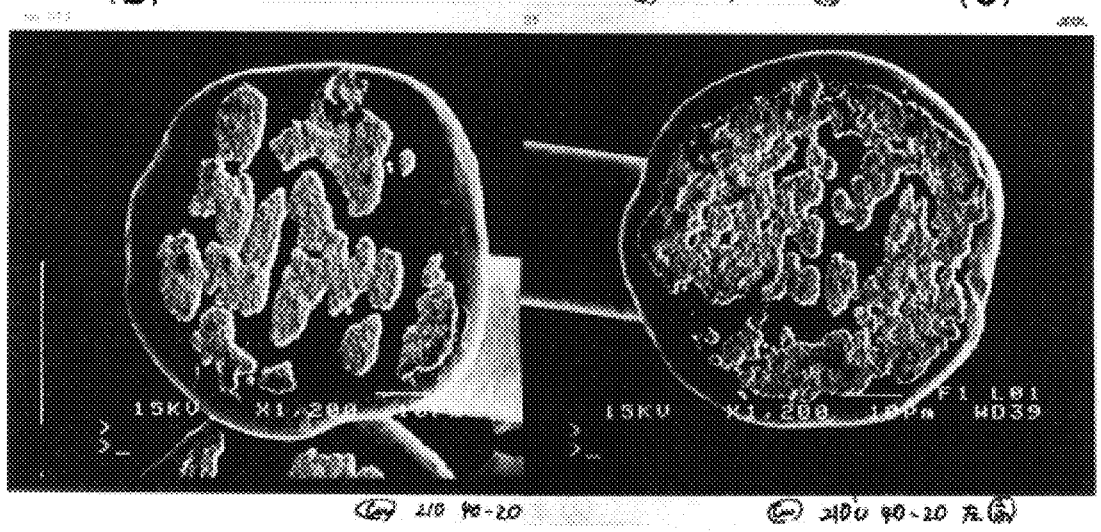
Figure 16:
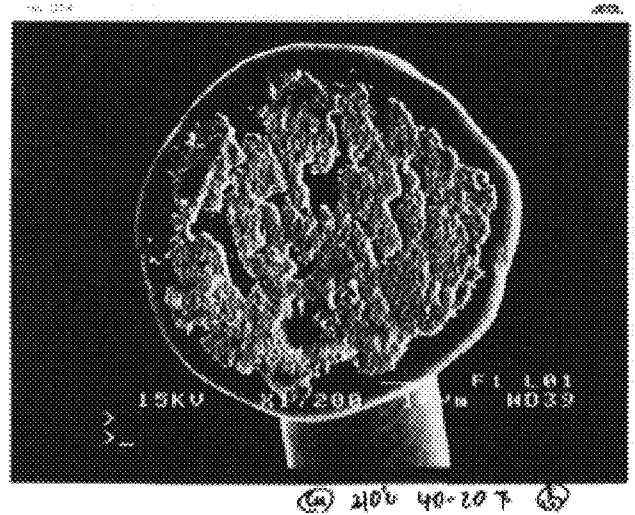
Figure 17:
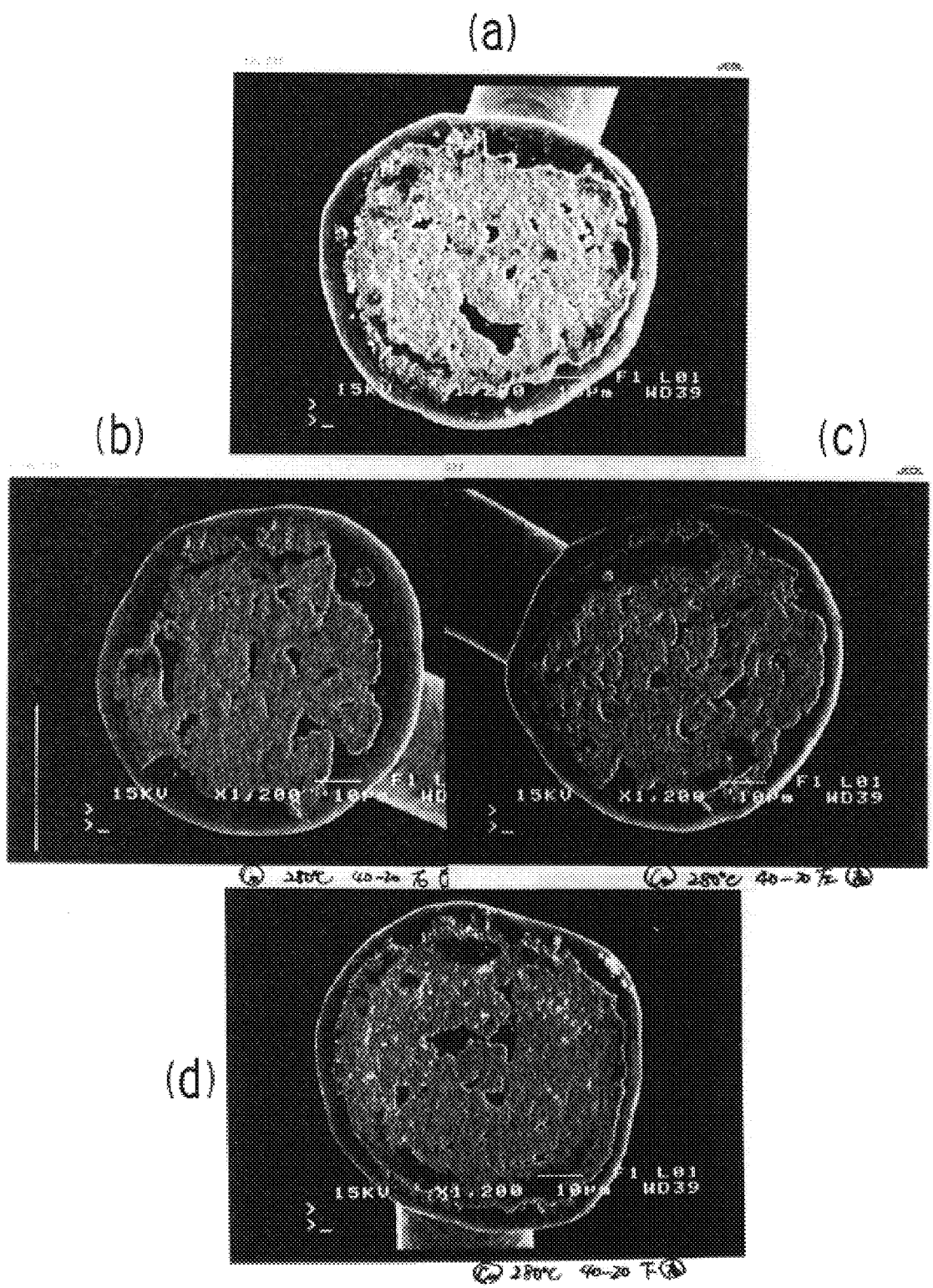
FIG. 17 is a view to show the joint condition in the case where the sample of 280° C.
Figure 18:
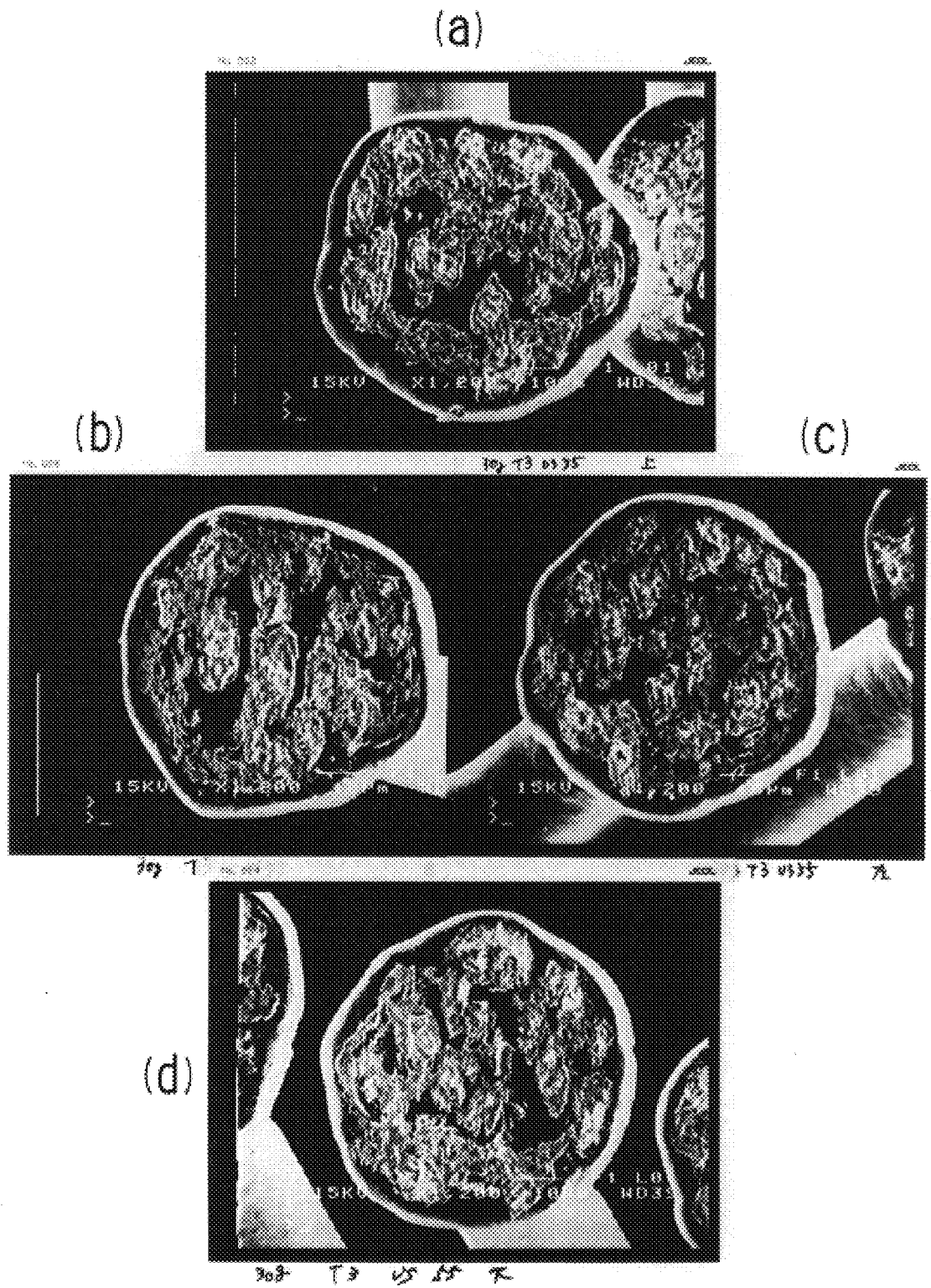
FIG. 18 is a view to show the joint condition after application of the fourth load by the wire bonding method of Embodiment 1 of the present invention.

Further, in the final stage, the fourth bonding load is applied at a high amount of about 25 to 40 gf for the time of 3 to 5 ms so as to make energy of supersonic wave vibration work in a concentrated manner on a peripheral part of the joint of the metal ball 3b, whereby plastic deformations of the metal ball 3b and bonding pad 2 are caused at the peripheral part of the metal ball 3b, and as shown in FIGS. 16 and 19, the band-like joint 7 can be formed in a manner to surround the whole of plural island-shaped joints 6b.

In the above explanation, the first to fourth bonding load amounts shown in the present Embodiment are the amounts applicable to a metal ball 3b of about 55 $\mu$m in diameter formed at a tip of a metal wire 3a of 30 $\mu$m in diameter, and in the case where the size of the metal ball 3b is different, the bonding load amount is required to be changed according to the size. That is to say, by making the amount obtained by dividing the bonding load amount by the sectional area prior to deformation of the metal ball 3b to 40–50 mgf/$\mu$m$^2$ at the time of the first bonding load, 10–20 mgf/$\mu$m$^2$ at the time of the second bonding load, 4–10 mgf/$\mu$m$^2$ at the time of the third bonding load, and 10–20 mgf/$\mu$m$^2$ at the time of the fourth bonding load, there is obtained a joint comprising plural island-shaped joints 6b and a band-like joint 7 surrounding the whole of the island-shaped joints 6b in the same manner as this embodiment, thus making it possible to carry out highly reliable wire bonding. In such case, the time of applying the first bonding load is not more than 3 ms, the time of applying the third bonding load is 5–15 ms, and the time of applying the fourth bonding load is 1–5 ms.

In this embodiment, there is employed a die bond material comprising polyimide and epoxy resin as a main material, using phenol as a curing agent, and filled with silver powder. However, the components of the resin materials are not to be limited.

As described above, according to the wire bonding method of the present Embodiment, the joint nucleus 6a is sufficiently formed at the joint between the metal ball 3b and bonding pad 2; the deformation amount of the metal ball 3b can be properly set; it is possible to improve remarkably the reliability of fine wire bonding joints as represented by plastic package with fine pad pitch and multi-pin; and it is possible to provide the high quality semiconductor device at a low price.

Embodiment 2

Figure 20:
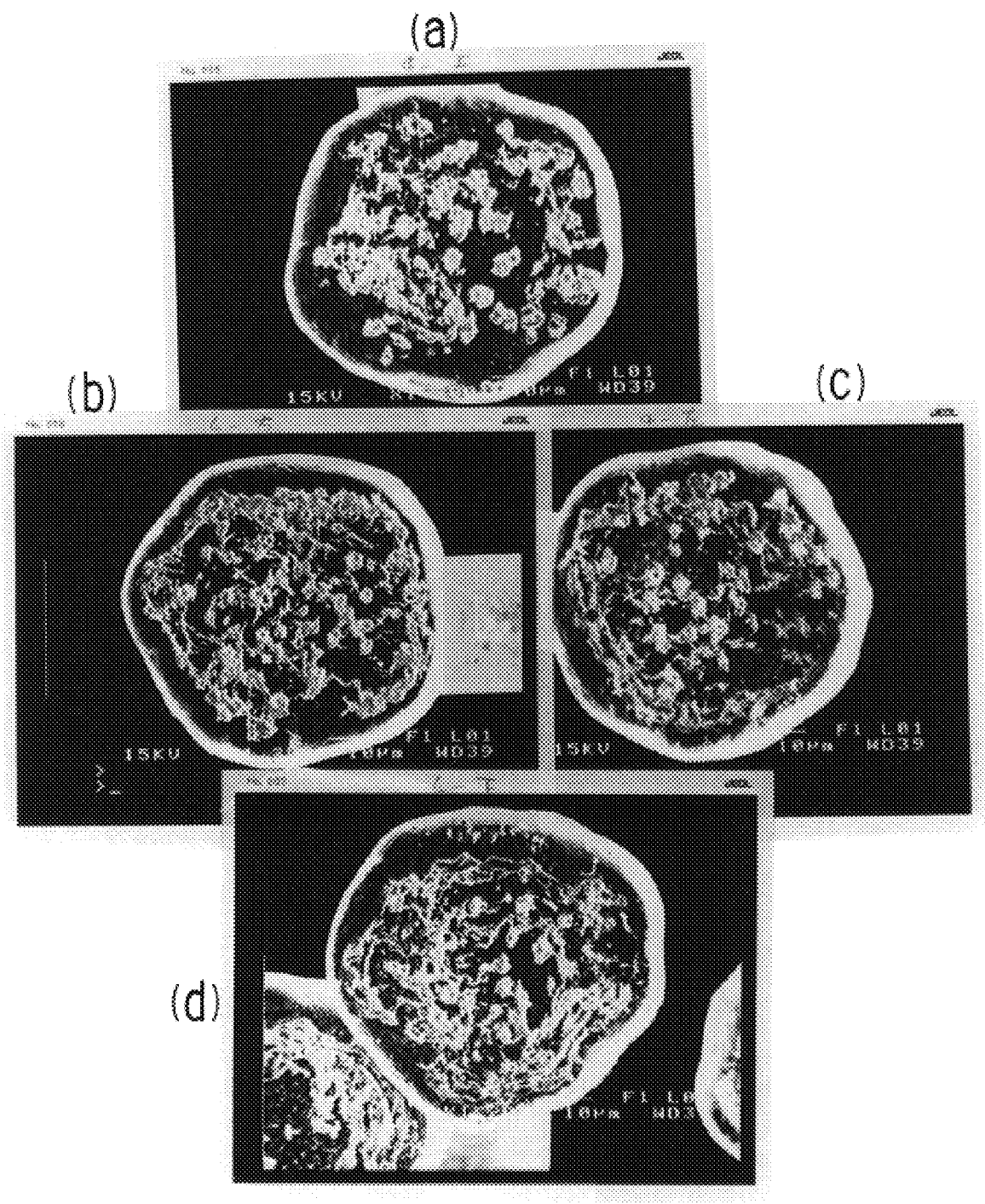
FIG. 20 is a view to show the joint condition by a wire bonding method of Embodiment 2 of the present invention.
Figure 21:
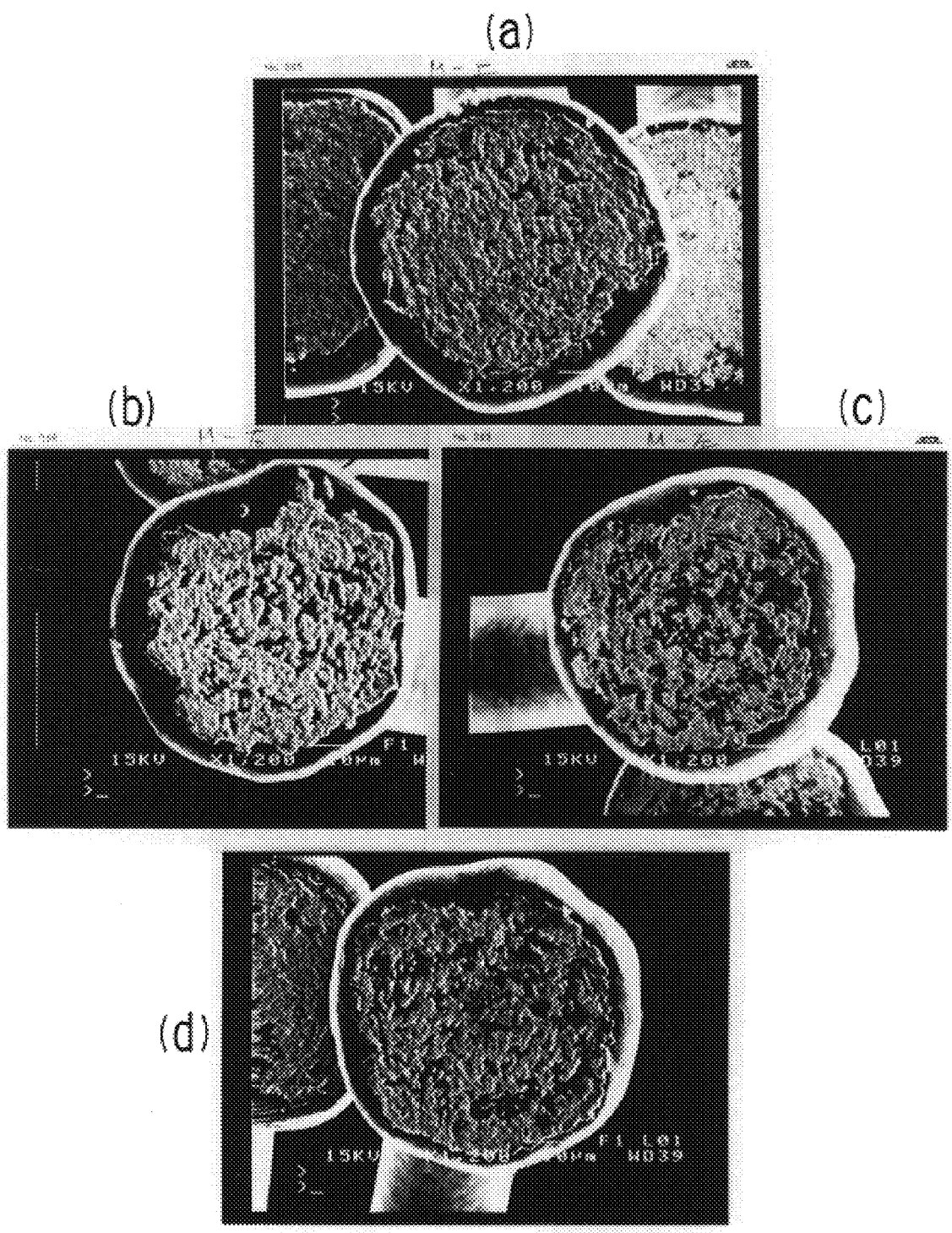
FIG. 21 is a view to show the joint condition by the wire bonding method of Embodiment 2 of the present invention.

Hereinafter, description is given on the wire bonding method of the second embodiment of the present invention. Since the constitution of the semiconductor device to be used in this Embodiment is the same as that of Embodiment 1, FIGS. 1 and 2 are quoted in making the following explanation. A semiconductor element 1 is connected to a lead frame 4 comprising mainly Fe and Ni by using a die bond material 5 comprising solder as a main component. The following explanation is given on the case where a metal wire 3a comprising mainly Au of 30 $\mu$m in diameter and having a metal ball 3b of about 55 $\mu$m in diameter, made by melting and solidifying the tip of the metal wire 3a is joined to a bonding pad 2 of 80 $\mu$m in one side comprising mainly Al and formed on the semiconductor element 1, by using the load and supersonic wave energy of about 60 kHz supplied through a capillary 8 and heat supplied from the lower face of the semiconductor element As in this Embodiment, in the case where the die bond material 5 is a solder, such material has a larger Young's modulus than the resin by about one figure, so that it has high transmission efficiency of supersonic wave vibration. Because of this, the band-like joint 7 (refer to FIG. 19) by the deformation of the metal ball 3b is more easily formed by less supersonic wave vibration energy than the case of resin die bond material, even under the same temperature conditions. Accordingly, by suppressing the amplitude of supersonic wave vibration at the time of application of the third bonding load to about 60% of the case of the lead frame 4 comprising mainly Cu shown in Embodiment 1, it is possible to form the island-shaped joint 6b (refer to FIG. 19) over the whole joint surface, as shown in FIGS. 20 and 21. In this Embodiment, at the joint temperatures of 210° C. (FIG. 20) and 280° C. (FIG. 21), the size of respective island-shaped joints 6b becomes small at a low temperature. Subsequently, by applying the fourth bonding load in the same manner as in the case of Embodiment 1, the band-like joint 7 can be formed in a manner to surround the whole of plural island-like joints 6b. Further, in the same manner as in Embodiment 1, even after the preservation at a high temperature, the form of the joint is preserved.

In the above Embodiments 1 and 2, each of the first to fourth bonding load amounts can be further finely divided into the optional wave shapes within the range described in the explanation of the bonding load amount. Further, while the frequency of the supersonic wave vibration is shown as about 60 kHz, the frequency might be about several hundred kHz. It is also possible to change the frequency and amplitude in one joint forming period. While there is taken as an example the case where the metal wire 3a comprising Au as the main component is to be joined to the bonding pad 2 comprising Al as the main component, metals such as Au, Ag, Cu, Al and Pt and their alloys and compounds might be used as a material for the metal wire 3a and bonding pad 2. Further, the wire diameter of the metal wire and the size of the bonding pad are not limited. In the above Embodiments 1 and 2, description is made about a bonding technique for joining the metal ball 3b with the bonding pad 2 after forming a metal ball 3b by melting and solidifying the tip of the metal wire 3a. However, the present invention is also applicable to a wedge bonding technique of directly joining the metal wire 3a with the bonding pad 2. Moreover, it is applicable to the joining at a room temperature.

Embodiment 3

Figure 22A:
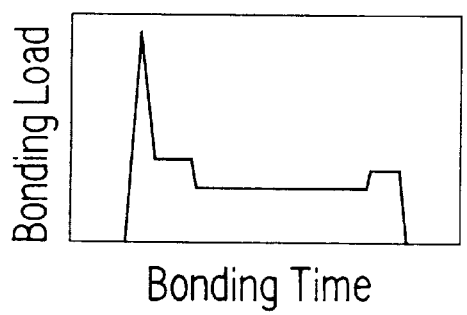
FIG. 22 is a view to show relationship between time for application of the load and forming condition of inter-metal compound at the joint by a wire bonding method of Embodiment 3 of the present invention.
Figure 22A:
Figure 22A:
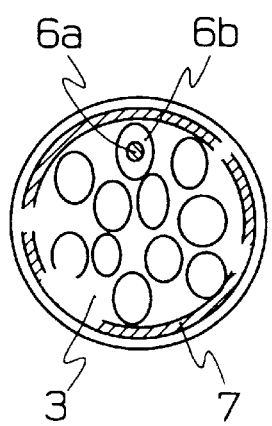
Figure 22B:
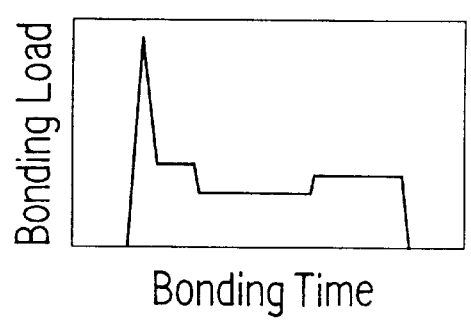
Figure 22B:
Figure 22B:
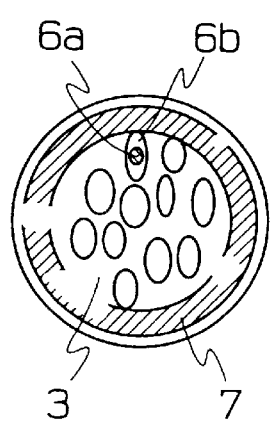

Hereinafter, description is given on the wire bonding method of the third embodiment of the present invention. This embodiment is to control the ratio of a band-like joint 7 to plural elliptical island-shaped joints 6b formed at a joint interface between a metal ball 3b and a bonding pad 2 according to the joining property of the bonding pad 2, as shown in FIGS. 1 and 2 and FIG. 22. The control of the ratio can be realized by adjusting the third and the fourth bonding loads and the time of application of supersonic wave vibration. For example, in the case where the bonding pad is thin, by increasing the ratio of the time of application of the third bonding load as shown in FIG. 22(a), joining can be achieved without causing the exclusion of the bonding pad 2 by a large plastic deformation amount. In its cross-section, the ratio of the island-shaped joint 6b is higher, and the ratio of the band-like joint 7 is lower. To a bonding pad 2 having a low joining property, when the ratio of the fourth bonding load application time is increased as shown in FIG. 22(b), joining can be achieved by utilizing the large plastic deformation amount. In its cross-section, the ratio of the island-shaped joint 6b is lower, and the ratio of the band-like joint 7 is higher.

Embodiment 4

Figure 23:
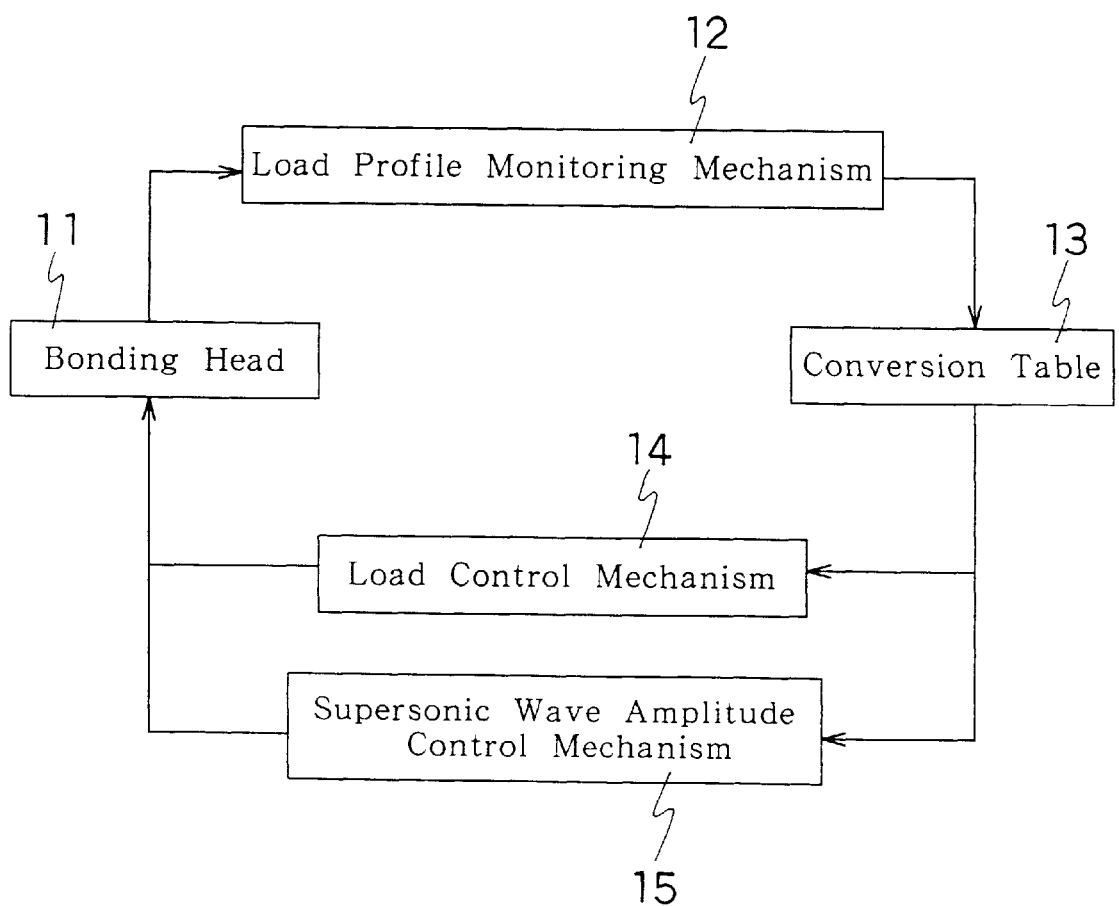
FIG. 23 is a view to show the constitution of a wire bonding apparatus of Embodiment 4 of the present invention.
Figure 24:
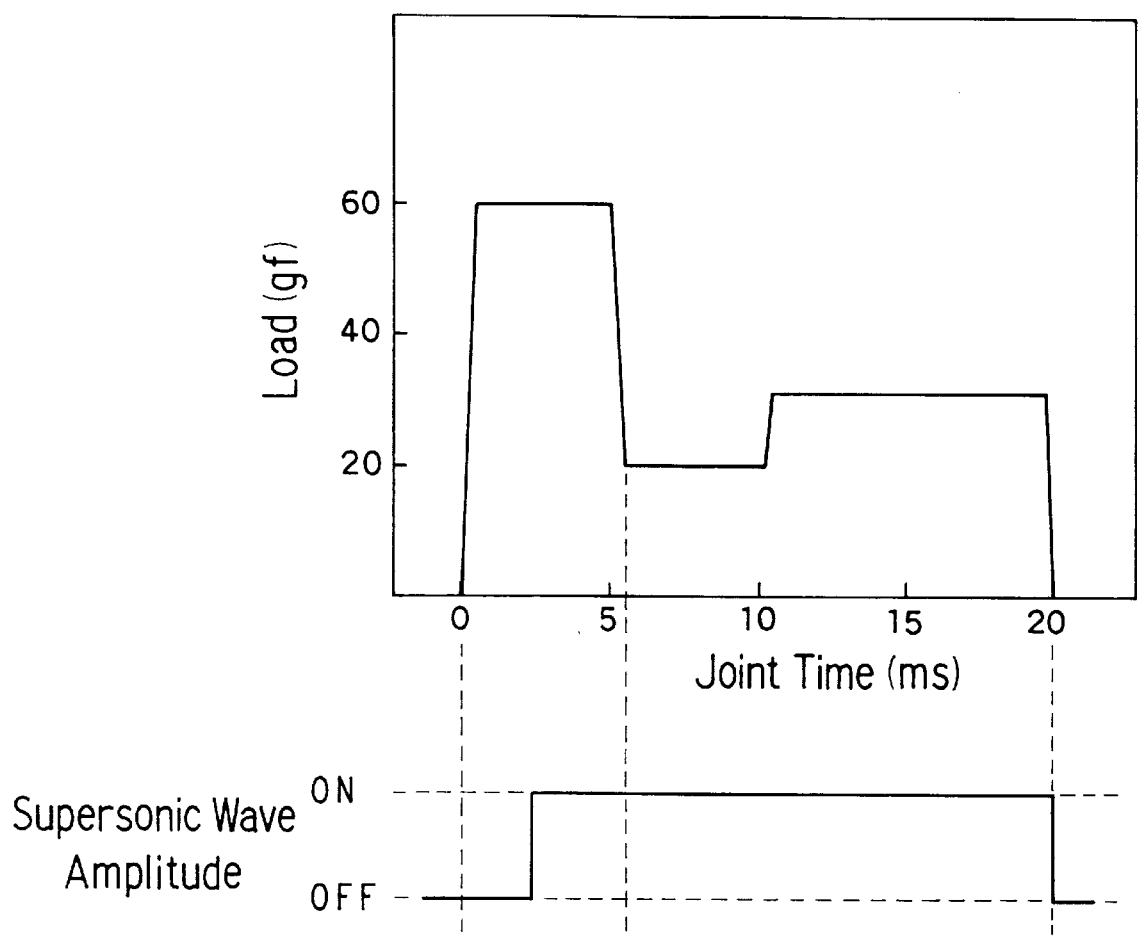
FIG. 24 is a view to show relationship between load and timing for application of supersonic wave vibration, and joint time by the conventional wire bonding method.

FIG. 23 is a view to illustrate the constitution of the wire bonding apparatus of Embodiment 4 of the present invention. The present apparatus is an apparatus for joining a metal wire with a bonding pad disposed on the semiconductor element by using a load and supersonic wave vibration. It is constituted by a stage (not illustrated) for placing a semiconductor device including the semiconductor element and a lead frame, a bonding head 11 for positioning the metal wire on the bonding pad of the semiconductor element with holding the metal wire, a load profile monitoring mechanism 12 for monitoring load profile of the bonding head 11, a conversion function or conversion table 13 to show correlation between the load profile and the strength and deformation amount of the wire bond joint, a load control mechanism 14 and a supersonic wave amplitude control mechanism 15 for calculating the subsequent load amount and amplitude of the supersonic wave vibration on receipt of the result from the monitor mechanism 12 to control the bonding head.

Next, description is given on the operation of the wire bonding apparatus according to this embodiment. This apparatus has, as shown in FIG. 1, a function to judge the forming amount of joint nucleus 6a (refer to FIG. 19) in the stage of elevating the first bonding load in a sharp gradient after the metal ball 3b came into contact with the bonding pad 2. With respect to the judging method, a load profile is measured by a load gauge installed under the bonding stage, and based on the load profile, reference is made to a conversion function or a conversion table 13 showing the correlation between the previously memorized load profile and the deformation amount and joint strength, and calculation is made to give the judgment results. These reference and judgment results are transmitted to a load control mechanism 14 and a supersonic wave vibration control mechanism 15 to effect control of the bonding head. At such time, in order to elevate the precision of judgment, a mechanism to monitor a diameter of the metal ball 3b can be used simultaneously. For monitoring the diameter of the metal ball 3b, there might be employed, for example, monitor of electric power consumed at the time of the formation of the metal ball 3b.

When installation of a load gauge is difficult, the result of monitoring deformation rate of the metal ball 3b can be utilized. As a procedure for monitoring the deformation rate, a laser displacement gauge capable of measuring the displacement of the capillary without contact might be employed. In the case where the mechanism for displacing the capillary has a displacement measuring mechanism such as an encoder, such means might be used to read the displacement rate. From such displacement information and the conversion function or conversion table representing correlation between the previously memorized displacement amount and the displacement amount and joint strength, subsequent pertinent third and fourth bonding load amounts and supersonic wave amplitude can be determined.

As described above, according to the wire bonding method and wire bonding apparatus of the present invention, by applying the first to fourth bonding load amounts for an optional duration, the joint nucleus can be sufficiently formed at the joint portion between the metal wire and bonding pad, and deformation amount of the metal wire can be appropriately set, so that it is possible to improve the reliability of the fine wire bonding joint to a remarkable degree, and to provide a high quality semiconductor device at a low cost.

What we claim is:

1. A wire bonding method for joining a metal wire with a bonding pad disposed on a semiconductor element by using a load and supersonic wave vibration, comprising: during interval of time from contact of the metal wire with the bonding pad to application of the supersonic wave vibration, continuously applying a first bonding load and a second bonding load which is lower than the first bonding load; and after application of the supersonic wave vibration, continuously applying a third bonding load of a size of about 50% of the load of the second bonding load and a fourth bonding load which is lower than the first bonding load and higher than the third bonding load.

2. The wire bonding method of claim 1, wherein the metal wire has a metal ball at a tip portion of the metal wire to be connected to the bonding pad.

3. The wire bonding method of claim 2, wherein the bonding load amount divided by the sectional area prior to deformation of the metal ball is made to 40–60 mgf/$\mu$m$^2$ at the time of the first bonding load, 10–20 mgf/$\mu$m$^2$ at the time of the second bonding load, 4–10 mgf/$\mu$m$^2$ at the time of the third bonding load, and 10–20 mgf/$\mu$m$^2$ at the time of the fourth bonding load.

4. The wire bonding method of claim 1, wherein the time of application of the first bonding load is not more than 3 ms, the time of application of the third bonding load is 5 to 15 ms, and the time of application of the fourth bonding load is 1 to 5 ms.

5. The wire bonding method of claim 2, wherein the time of application of the first bonding load is not more than 3 ms, the time of application of the third bonding load is 5 to 15 ms, and the time of application of the fourth bonding load is 1 to 5 ms.

6. The wire bonding method of claim 3, wherein the time of application of the first bonding load is not more than 3 ms, the time of application of the third bonding load is 5 to 15 ms, and the time of application of the fourth bonding load is 1 to 5 ms.

* * * * *